US012610552B2

(12) United States Patent
Chen et al.

(10) Patent No.: US 12,610,552 B2
(45) Date of Patent: Apr. 21, 2026

(54) MEMORY DEVICE AND METHOD FOR FORMING THE SAME

(71) Applicants: TAIWAN SEMICONDUCTOR MANUFACTURING COMPANY, LTD., Hsinchu (TW); NATIONAL TAIWAN UNIVERSITY, Taipei (TW); National Taiwan Normal University, Taipei City (TW)

(72) Inventors: Kuan-Ting Chen, Taichung City (TW); Chun-Yu Liao, Taipei City (TW); Kuo-Yu Hsiang, Kaohsiung City (TW); Yun-Fang Chung, Miaoli County (TW); Min-Hung Lee, Taipei City (TW); Shu-Tong Chang, Taoyuan City (TW)

(73) Assignees: TAIWAN SEMICONDUCTOR MANUFACTURING COMPANY, LTD., Hsinchu (TW); NATIONAL TAIWAN UNIVERSITY, Taipei (TW); NATIONAL TAIWAN NORMAL UNIVERSITY, Taipei (TW)

( * ) Notice: Subject to any disclaimer, the term of this patent is extended or adjusted under 35 U.S.C. 154(b) by 683 days.

(21) Appl. No.: 17/739,871

(22) Filed: May 9, 2022

(65) Prior Publication Data

US 2023/0363170 A1 Nov. 9, 2023

(51) Int. Cl.
*H10B 51/20* (2023.01)
*H10D 30/01* (2025.01)
(Continued)

(52) U.S. Cl.
CPC .......... *H10B 51/20* (2023.02); *H10D 30/031* (2025.01); *H10D 30/0415* (2025.01);
(Continued)

(58) Field of Classification Search
CPC .......... H01L 29/78391; H10D 30/0415; H10D 30/701; H10D 64/689
See application file for complete search history.

(56) References Cited

U.S. PATENT DOCUMENTS

| | | | | |
|---|---|---|---|---|
| 7,456,476 B2 * | 11/2008 | Hareland | ............... | H10D 30/62 |
| | | | | 257/349 |
| 2014/0151705 A1 * | 6/2014 | Xiao | .................... | H10D 30/021 |
| | | | | 977/890 |

(Continued)

FOREIGN PATENT DOCUMENTS

| | | |
|---|---|---|
| CN | 101047189 A | 10/2007 |
| TW | 546820 B | 8/2003 |

(Continued)

OTHER PUBLICATIONS

"Experimental Demonstration of Stacked Gate All-Around Poly-Si Nanowires Negative Capacitance FETs With Internal Gate Featuring Seed Layer and Free of Post-Metal Annealing Process" by Shen-Yang Lee et al. in IEEE Electron Device Letters, vol. 40, No. 11, Nov. 2019 (Year: 2019).*

(Continued)

*Primary Examiner* — Eric A. Ward
(74) *Attorney, Agent, or Firm* — Birch, Stewart, Kolasch & Birch, LLP

(57) ABSTRACT

A method includes forming a semiconductor layer over a substrate; depositing a first ferroelectric layer over a channel region of the semiconductor layer; depositing a first dielectric layer over the first ferroelectric layer; depositing a second ferroelectric layer over the first dielectric layer; depositing a gate metal layer over the second ferroelectric layer; patterning the gate metal layer, the second ferroelectric layer, the first dielectric layer, and the first ferroelectric layer to form a gate structure; and forming source/drain (Continued)

regions in the semiconductor layer and on opposite sides of the gate structure.

20 Claims, 20 Drawing Sheets

(51) Int. Cl.
| | |
|---|---|
| *H10D 30/67* | (2025.01) |
| *H10D 30/69* | (2025.01) |
| *H10D 62/10* | (2025.01) |

(52) U.S. Cl.
CPC ..... *H10D 30/6713* (2025.01); *H10D 30/6735* (2025.01); *H10D 30/6757* (2025.01); *H10D 30/701* (2025.01); *H10D 62/121* (2025.01)

(56) References Cited

U.S. PATENT DOCUMENTS

| | | | | |
|---|---|---|---|---|
| 2017/0162702 | A1* | 6/2017 | Hu ........................ | H10D 64/689 |
| 2018/0240804 | A1* | 8/2018 | Yoo ................... | H01L 21/02189 |
| 2018/0286988 | A1* | 10/2018 | Yoo ....................... | H10D 64/516 |
| 2019/0296122 | A1* | 9/2019 | Ino ........................ | H10D 64/689 |
| 2020/0105897 | A1* | 4/2020 | Hsu ..................... | H01L 21/0228 |
| 2021/0043654 | A1* | 2/2021 | Yoo ........................ | H10B 51/00 |
| 2023/0009791 | A1* | 1/2023 | Lee ...................... | H10D 30/701 |
| 2023/0062878 | A1* | 3/2023 | Heo ..................... | H10D 64/689 |
| 2023/0068904 | A1* | 3/2023 | Heo ..................... | H10D 64/685 |
| 2023/0107911 | A1* | 4/2023 | Choe .................. | H10D 30/6735 257/295 |
| 2023/0120089 | A1* | 4/2023 | Yoon ................... | H10D 30/701 257/295 |
| 2023/0238460 | A1* | 7/2023 | Kim ..................... | H10D 64/689 257/288 |

FOREIGN PATENT DOCUMENTS

| | | |
|---|---|---|
| TW | 202042347 A | 11/2020 |
| TW | 202046314 A | 12/2020 |

OTHER PUBLICATIONS

"High dielectric constant oxides" in Eur. Phys. J. Appl. Phys. 28, 265-291 (2004) to J. Robertson (Year: 2004).*

"Dielectric Constants of BeO, MgO, and CaO Using the Two-Terminal Method" by M. A. Subramanian, R. D. Shannon, B. H. T. Chai, M. M. Abraham & M. C. Wintersgill in Phys Chem Minerals (1989) 16:741-746 (Year: 1989).*

Agarwal et al., "Proposal for Capacitance Matching in Negative Capacitance Field-Effect Transistors", IEEE Electron Device Letters, Mar. 2019, vol. 40, No. 3, pp. 463-466.

Kahng et al., "A floating gate and its application to memory devices", The Bell System Technical Journal, Jul.-Aug. 1967, pp. 1288-1295.

Kim et al., "Grain size engineering for ferroelectric $Hf_{0.5}Zr_{0.5}O_2$ films by an insertion of $Al_2O_3$ interlayer", Applied Physics Letters, 2014, vol. 105, 192903-1-192903-5, total 6 pages.

Liao et al., "Multibit Ferroelectric FET Based on Nonidentical Double $HfZrO_2$ for High-Density Nonvolatile Memory", IEEE Electron Device Letters, Apr. 2021, vol. 42, No. 4, pp. 617-620.

Miller et al., "Physics of the ferroelectric nonvolatile memory field effect transistor", Journal of Applied Physics, 1992, vol. 72, No. 12, pp. 5999-6010.

Park et al., "The effects of crystallographic orientation and strain of thin $Hf_{0.5}Zr_{0.5}O_2$ film on its ferroelectricity", Applied Physics Letters, 2014, vol. 104, 072901-1-072901-5, total 6 pages.

Park et al., "Surface and grain boundary energy as the key enabler of ferroelectricity in nanoscale hafnia-zirconia: a comparison of model and experiment", Nanoscale, 2017, vol. 9, pp. 9973-9986.

Zeng et al., "2-Bit/Cell Operation of $Hf_{0.5}Zr_{0.5}O_2$ Based FeFET Memory Devices for NAND Applications", IEEE Journal of the Electron Devices Society, 2019, vol. 7, pp. 551-556.

* cited by examiner

MEMORY DEVICE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1B, 1C, and 11D illustrate cross-sectional views of a memory device in accordance with some embodiments of the present disclosures.

FIGS. 2A to 2C illustrate schematic views of ferroelectric stacks in accordance with some embodiments of the present disclosure.

DETAILED DESCRIPTION

Figure 1A:
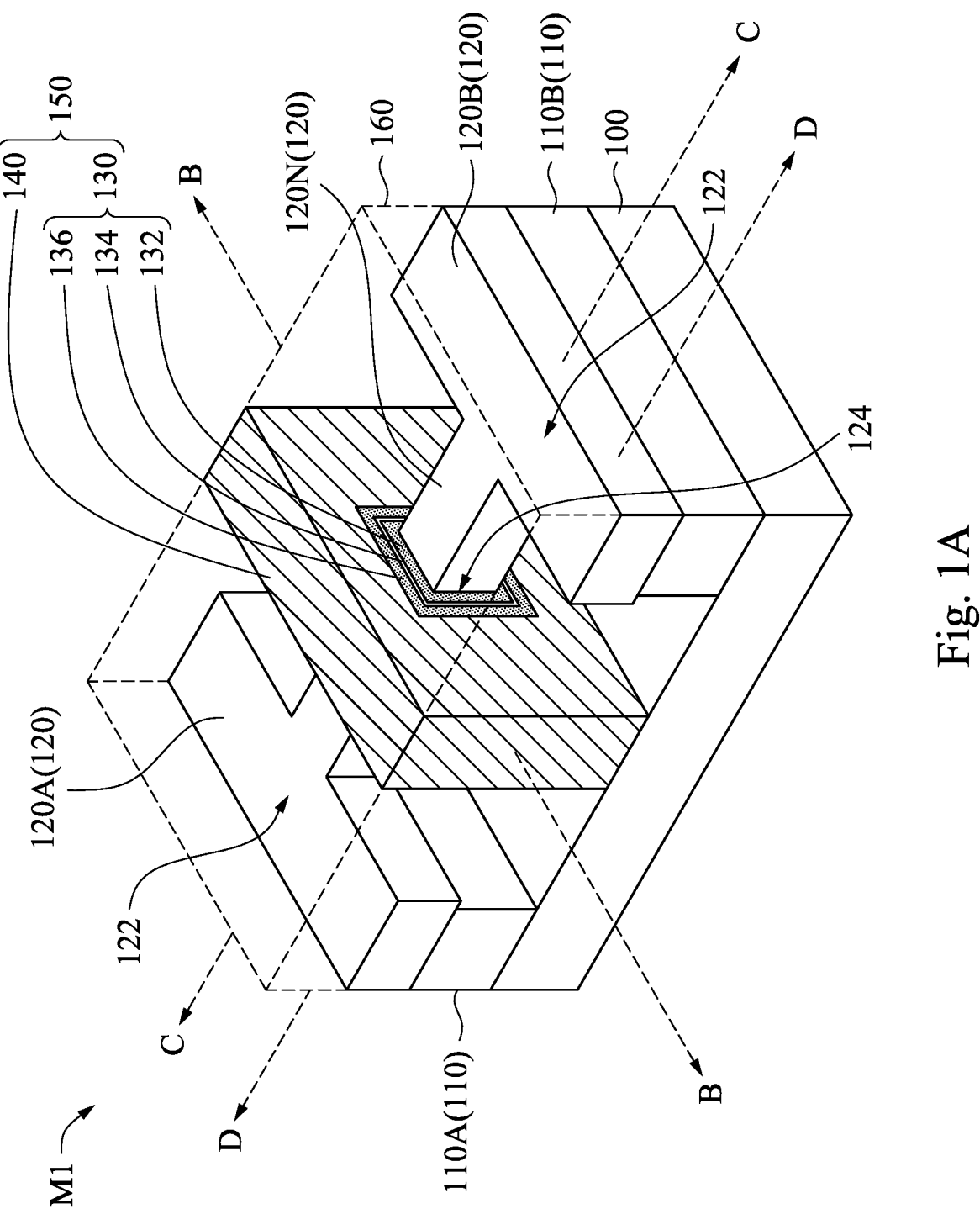
FIG. 1A illustrates a schematic view of a memory device in accordance with some embodiments of the present disclosures.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figures 1B, 1C, 1D:
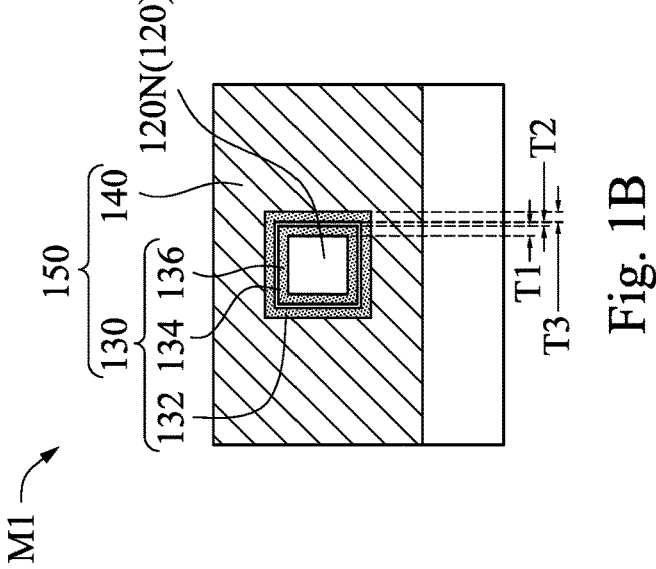

FIG. 1A illustrates a schematic view of a memory device in accordance with some embodiments of the present disclosures. FIGS. 1B, 1C, and 1D illustrate cross-sectional views of a memory device in accordance with some embodiments of the present disclosures. In greater details, FIGS. 1B, 1C, and 1D illustrates cross-sectional views taken along line B-B, line C-C, and line D-D of FIG. 1A, respectively.

It is understood that the structure shown in FIGS. 1A to 1D uses a ferroelectric 3D-FET, which includes a semiconductor nanostructure (e.g., nanowire, nanosheet, or the like), to serve as a non-volatile memory device, while the structure can also be planar FET, nanosheet FET, FinFET, omega FET, GAA FET in other embodiments.

Shown there is a memory device M1. The memory device M1 includes a substrate 100. In some embodiments, the substrate 100 may be a semiconductor material and may include known structures including a graded layer or a buried oxide, for example. In some embodiments, the substrate 100 may include III-V compound semiconductor, such as GaAs, InP, GaN, InGaAs, InAlAs, or the like. In some embodiments, the substrate 100 may include IV semiconductor, such as silicon, germanium, or combinations thereof, which may be undoped or doped (e.g., p-type, n-type, or a combination thereof). Other materials that are suitable for semiconductor device formation may be used. Other materials, such as germanium, quartz, sapphire, and glass could alternatively be used for the substrate 100. Alternatively, the silicon substrate 100 may be an active layer of a semiconductor-on-insulator (SOI) substrate or a multi-layered structure such as a silicon-germanium layer formed on a bulk silicon layer. In some other embodiments, the substrate 100 may include transition-metal dichalcogenides (TMD).

A dielectric layer 110 is disposed over the substrate 100. In some embodiments, the dielectric layer 110 at least includes a first portion 110A and a second portion 110B separated from each other in a cross-sectional view. For example, in FIGS. 1C and 1D, the first portion 110A of the dielectric layer 110 is laterally separated from the second portion 110B of the dielectric layer 110. In some embodiments, the dielectric layer 110 may include oxide, such as silicon oxide. In some embodiments, the dielectric layer 110 may include nitride, such as silicon nitride.

A semiconductor layer 120 is disposed over and in contact with the dielectric layer 110. In some embodiments, the semiconductor layer 120 is vertically separated from the substrate 100 by the dielectric layer 110. The semiconductor layer 120 may be made of silicon. In some embodiments, the semiconductor layer 120 may include poly silicon. In some embodiments, the semiconductor layer 120 may be doped (e.g., p-type, n-type, or a combination thereof).

In some embodiments, the semiconductor layer 120 includes a first portion 120A over and in contact with the first portion 110A of the dielectric layer 110, and a second portion 120B over and in contact with the second portion 110B of the dielectric layer 110. The semiconductor layer 120 further includes a nanowire portion 120N extending between the first portion 120A and the second portion 120B and suspended over the substrate 100. In some embodiments, the first portion 120A and the second portion 120B of the semiconductor layer 120 have a lengthwise direction extending along a first direction, while the nanowire portion 120N of the semiconductor layer 120 has a lengthwise direction extending along a second direction that is perpendicular to the first direction.

In some embodiments, the nanowire portion 120N of the semiconductor layer 120 may include a rectangular cross-section. However, the disclosure is not limited thereto. In some other embodiments, the nanowire portion 120N of the semiconductor layer 120 may include a substantially rectangular cross-section with rounded corners. In yet some other embodiments, the semiconductor layer 120 may include a circular cross-section.

In some embodiments, although the first portion 120A of the semiconductor layer 120 is over and in contact with the first portion 110A of the dielectric layer 110, the sidewall of the first portion 120A of the semiconductor layer 120 is misaligned with the sidewall of the first portion 110A of the dielectric layer 110. For example, as shown in FIG. 1D, the sidewall of the first portion 120A of the semiconductor layer 120 laterally protrudes beyond the sidewall of the first portion 110A of the dielectric layer 110, such that a least a portion of the bottom surface of the first portion 120A of the semiconductor layer 120 is free from coverage by the first portion 110A of the dielectric layer 110. Similarly, although the second portion 120B of the semiconductor layer 120 is over and in contact with the second portion 110B of the dielectric layer 110, the sidewall of the second portion 120B of the semiconductor layer 120 is misaligned with the sidewall of the second portion 110B of the dielectric layer 110. For example, as shown in FIG. 1D, the sidewall of the second portion 120B of the semiconductor layer 120 laterally protrudes beyond the sidewall of the second portion 110B of the dielectric layer 110, such that a least a portion of the bottom surface of the second portion 120B of the semiconductor layer 120 is free from coverage by the second portion 110B of the dielectric layer 110.

The semiconductor layer 120 may include source/drain regions 122 and a channel region 124 between the source/drain regions 122. In some embodiments, the channel region 124 may be region of the nanowire portion 120N of the semiconductor layer 120 that is wrapped by a gate structure (e.g., the gate structure 150). The source/drain regions 122 are doped regions in the semiconductor layer 120 and are located on opposite sides of the channel region 124. In some embodiments, the source/drain regions 122 include p-type dopants such as boron for formation of p-type devices. In some other embodiments, the source/drain regions 122 include n-type dopants such as phosphorus for formation of n-type devices. In some embodiments, the source/drain regions 122 may be epitaxial structures doped with p-type dopants or n-type dopants. In some embodiments, the source/drain regions 122 have a conductivity type different from a conductivity type of the channel region 124 of the nanowire portion 120N of the semiconductor layer 120.

The memory device M1 includes a ferroelectric stack 130 wrapping around the channel region 124 of the nanowire portion 120N of the semiconductor layer 120. In greater details, the ferroelectric stack 130 includes a first ferroelectric layer 132, a dielectric layer 134 over the first ferroelectric layer 132, and a second ferroelectric layer 136 over the dielectric layer 134. Stated another way, the ferroelectric stack 130 can be regarded as having a bottom ferroelectric layer 132, a middle dielectric layer 134, and a top ferroelectric layer 136.

As shown in the cross-sectional view of FIG. 1B, the first ferroelectric layer 132 wraps around the nanowire portion 120N of the semiconductor layer 120, and is in contact with at least four sides of the nanowire portion 120N of the semiconductor layer 120. In greater details, the first ferroelectric layer 132 is in contact with bottom surface, top surface, and opposite sidewalls of the nanowire portion 120N of the semiconductor layer 120.

In some embodiments, the first ferroelectric layer 132 and the second ferroelectric layer 136 may be made of a same material, such as strontium bismuth tantalite (e.g., SBT), lead zirconate titanate (e.g., PZT), hafnium zirconium oxide (e.g., $HfZrO_2$; HZO), doped hafnium oxide (e.g., Si:HfO2), HAO (Al-Doped $HfO_2$), HSO (Si-Doped $HfO_2$), some other suitable ferroelectric material(s), or any combination of the foregoing. In some embodiments where the first ferroelectric layer 132 and the second ferroelectric layer 136 are made of $HfZrO_2$ (HZO), the atomic percentage of Zr atoms is in a range from about 40% to about 60%, such as 50% ($Hf_{0.5}Zr_{0.5}O_2$).

In some embodiments, the first ferroelectric layer 132 and the second ferroelectric layer 136 are made of high-k material, and thus the first ferroelectric layer 132 and the second ferroelectric layer 136 can also be referred to as high-k ferroelectric layers. In some embodiments, the dielectric constants of the first ferroelectric layer 132 and the second ferroelectric layer 136 are higher than dielectric constant of the dielectric layer 134.

In some embodiments, the dielectric layer 134 may be made of oxide, such as aluminum oxide ($Al_2O_3$), silicon oxide ($SiO_2$).

As shown in the cross-sectional view of FIG. 1B, first ferroelectric layer 132, the dielectric layer 134, the second ferroelectric layer 136 have thicknesses T1, T2, and T3, respectively. In some embodiments, the thickness T2 of the dielectric layer 134 is lower than the thickness T1 of the first ferroelectric layer 132 and the thickness T3 of the second ferroelectric layer 136. That is, the dielectric layer 134 is the thinnest layer of the ferroelectric stack 130. In some embodiments, the thickness T1 of the first ferroelectric layer 132 may be equal to or greater than the thickness T3 of the second ferroelectric layer 136. That is, the thickness T1 of the first ferroelectric layer 132 is not less than the thickness T3 of the second ferroelectric layer 136.

In some embodiments, the thickness T2 of the dielectric layer 134 is in a range from about 0.1 nm to about 0.7 nm. The thicknesses T1 and T3 are in a range from about 5 nm to about 10 nm. For example, when the first ferroelectric layer 132 and the second ferroelectric layer 136 have the same thickness, the thicknesses T1 and T3 may be bout about 7.5 nm, or may be about 10 nm. When the first ferroelectric layer 132 is thicker than the second ferroelectric layer 136, the thicknesses T1 and T3 may be about 10 nm and 5 nm, or the thicknesses T1 and T3 may be about 15 nm and 10 nm. In some embodiments, the thickness T1 is twice the thickness T3. If the thickness of each of the first ferroelectric layer 132 and the second ferroelectric layer 136 is too low (e.g., much lower than 5 nm), the first ferroelectric layer 132 and the second ferroelectric layer 136 are not thick enough to provide ferroelectricity. If the thickness of each of the first ferroelectric layer 132 and the second ferroelectric layer 136 is too larger (e.g., much greater than 10 nm), the device performance may degrade.

In some embodiments, the sum of the thicknesses T1 and T3 is less than about 30 nm. That is, the total thickness of the first ferroelectric layer 132 and the second ferroelectric layer 136 is less than about 30 nm. If the total thickness of the first ferroelectric layer 132 and the second ferroelectric layer 136 is too large (e.g., much greater than 30 nm), the device performance may degrade.

In some embodiments, the first ferroelectric layer 132 and the second ferroelectric layer 136 may be made of a same material that is different from the material of the dielectric layer 134. In some embodiments, although the dielectric layer 134 is not a ferroelectric material, the dielectric layer 134 is thin enough such that the ferroelectric stack 130 can still exhibit ferroelectricity.

The ferroelectric stack 130 is configured to store a bit of data, and thus serves as a memory cell. For example, in a first state atoms in the ferroelectric stack 130 are polarized in a first direction (e.g., "up" direction) may represent a binary value of "1", whereas in a second state atoms in the ferroelectric stack 130 are polarized in a second direction (e.g., "down" direction) may represent a binary value of "0", or vice versa.

The memory device M1 includes a gate metal 140 wrapping around the ferroelectric stack 130. In some embodiments, the bottom surface of the gate metal 140 may be in contact with the top surface of the substrate 100. In some embodiments, the gate metal 140 may be thicker than the first ferroelectric layer 132, the dielectric layer 134, and the second ferroelectric layer 136 of the ferroelectric stack 130. For example, the thickness of the gate metal 140 may be may be in a range from about 1 nm to about 1000 nm, such as 120 nm. In some embodiments, the gate metal 140 may be made of TaN, TiN, W, Pt, Mo, Ta, Ti, Silicide, or combinations thereof. In some embodiments, the gate metal 140 and the ferroelectric stack 130 can be collectively referred to as a gate structure 150.

The memory device M1 includes an interlayer dielectric (ILD) layer 160. The ILD layer 160 laterally surrounds the gate structure 150, and wraps around other portions of the nanowire portion 120N of the semiconductor layer 120. In some embodiments, the ILD layer 160 is in contact with the bottom surface of the nanowire portion 120N of the semiconductor layer 120, and further extends to the top surface of the substrate 100. The ILD layer 160 may include phospho-silicate glass (PSG), boro-silicate glass (BSG), boron-doped phospho-silicate glass (BPSG), undoped silicate glass (USG), or the like.

As shown in FIG. 1D, the ILD layer 160 is further in contact with the bottom surfaces of the first portion 120A and the second portion 120B of the semiconductor layer 120. As a result, in FIG. 1D, the ILD layer 160 may include a lower portion, a middle portion over the lower portion, and an upper portion over the middle portion 160B, in which the lower portion is below the bottom surface of the semiconductor layer 120 and in contact with the dielectric layer 110, the middle portion is vertically between the bottom surface and top surface of the semiconductor layer 120 and in contact with the sidewall of the semiconductor layer 120, and the upper portion is above and in contact with the top surface of the semiconductor layer 120. As illustrated in the cross-sectional view of FIG. 1D, the middle portion is narrower than the lower portion and the upper portion, and the lower portion is narrower than the upper portion. That is, the interface between the ILD layer and the semiconductor layer 120 is closer to the gate structure 150 than the interface between the ILD layer and the dielectric layer 110.

Figures 2A, 2B, 2C:
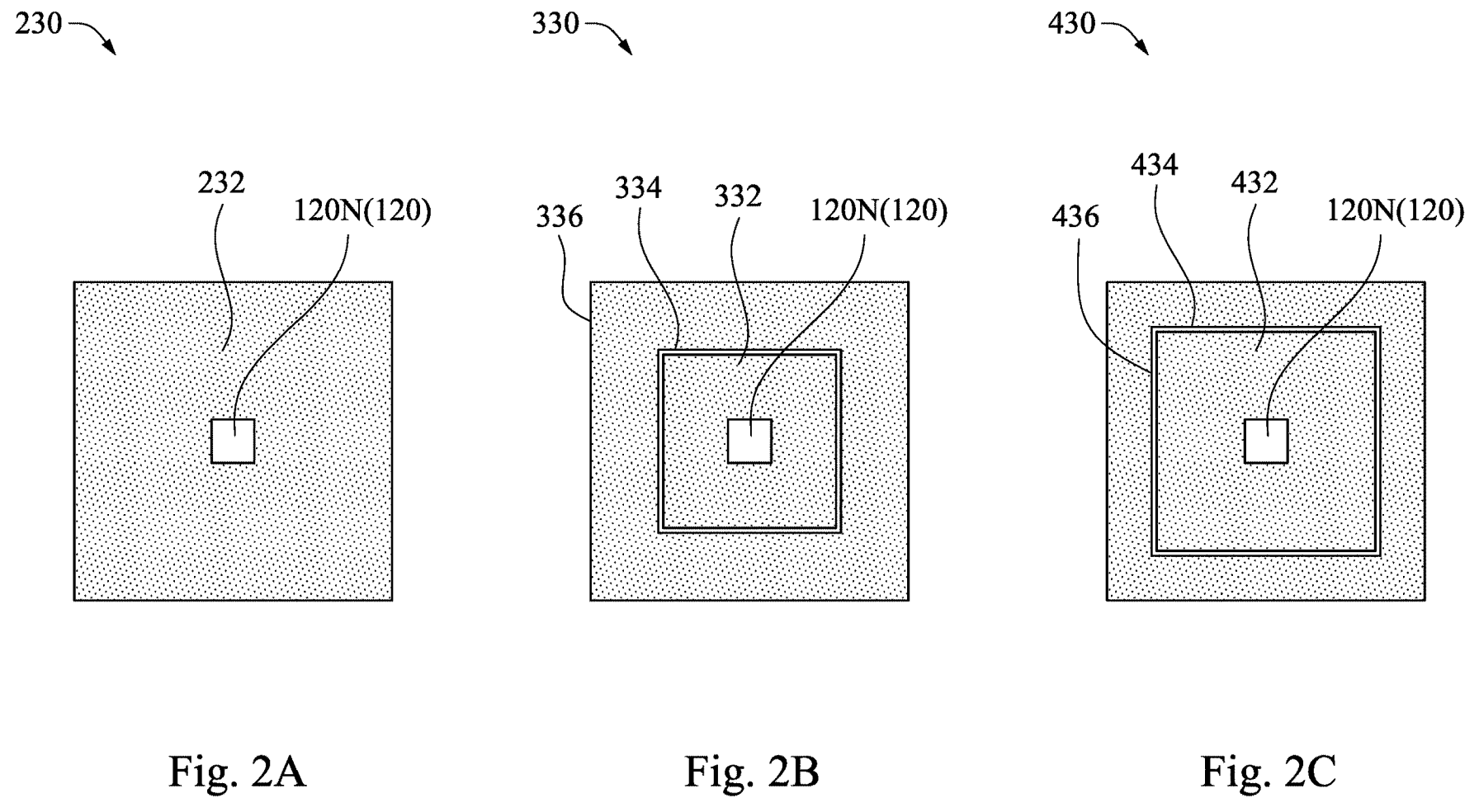
Figure 2D:
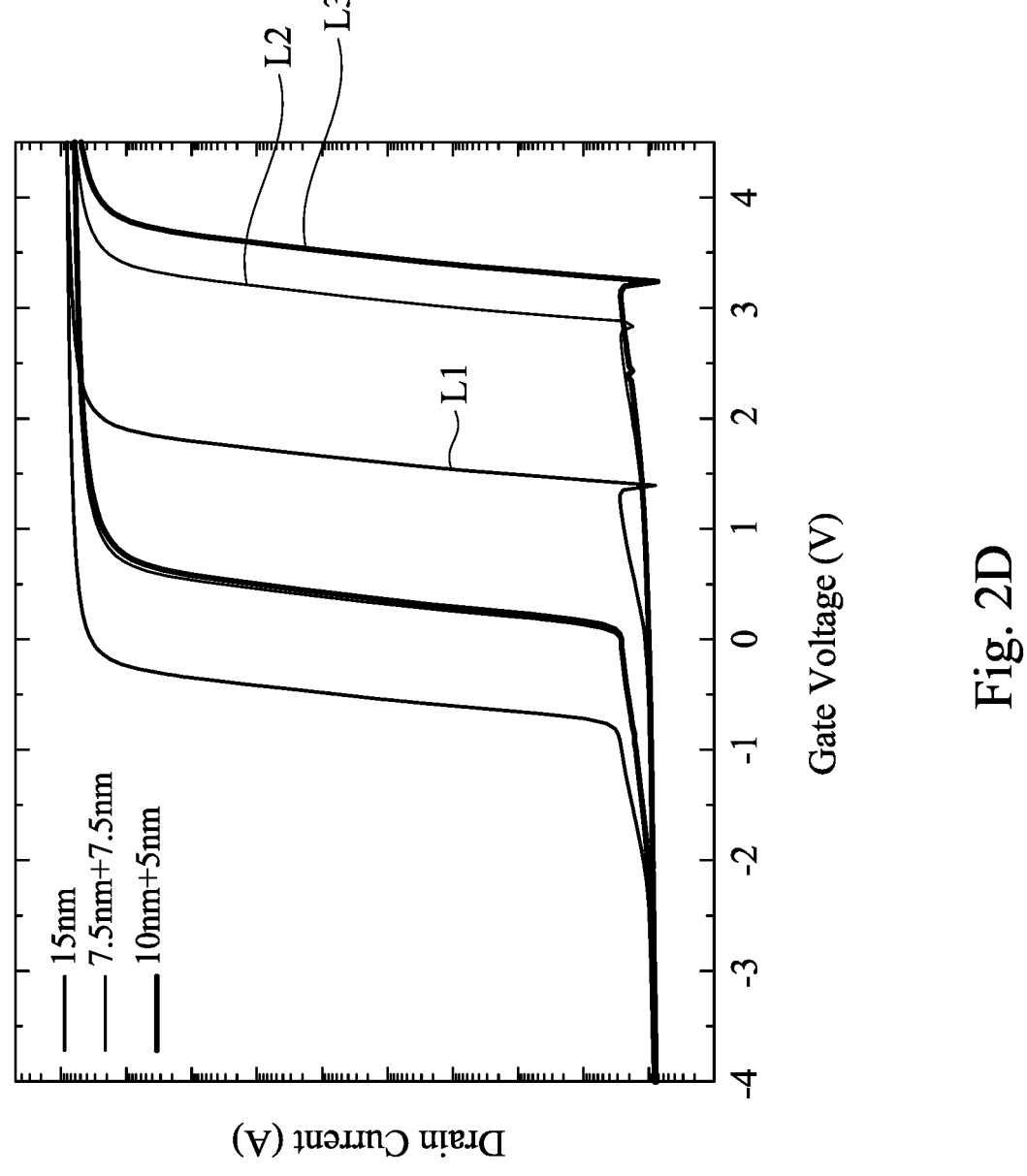
FIG. 2D illustrate experiment results of memory devices in accordance with some embodiments of the present disclosure.

FIGS. 2A to 2C illustrate schematic views of ferroelectric stacks in accordance with some embodiments of the present disclosure. FIG. 2D illustrate experiment results of memory devices in accordance with some embodiments of the present disclosure.

FIG. 2A illustrates a ferroelectric stack 230 that is different from the ferroelectric stack 130 as discussed in FIGS. 1A to 1D, in that the ferroelectric stack 230 of FIG. 2A does not include a dielectric layer (e.g., the dielectric layer 134 of the ferroelectric stack 130), and include a single ferroelectric layer 232. In some embodiments, the thickness of the ferroelectric layer 232 is about 15 nm.

FIG. 2B illustrates a ferroelectric stack 330 that is similar to the ferroelectric stack 130 as discussed in FIGS. 1A to 1D. For example, the ferroelectric stack 330 also includes a first ferroelectric layer 332, a dielectric layer 334, and a second ferroelectric layer 336, in which the first ferroelectric layer 332 and the second ferroelectric layer 336 have a same thickness. In some embodiments, the thickness of the first ferroelectric layer 332 and the second ferroelectric layer 336 is about 7.5 nm.

FIG. 2C illustrates a ferroelectric stack 430 that is similar to the ferroelectric stack 130 as discussed in FIGS. 1A to 1D. For example, the ferroelectric stack 430 also includes a first ferroelectric layer 432, a dielectric layer 434, and a second ferroelectric layer 436, in which the first ferroelectric layer 432 is thicker than the second ferroelectric layer 436. In some embodiments, the thickness of the first ferroelectric layer 432 is about 10 nm, and the thickness of the second ferroelectric layer 436 is about 5 nm. That is, the thickness of the first ferroelectric layer 432 is twice the thickness of the second ferroelectric layer 436.

It is noted that the dielectric layer 334 of FIG. 2B and the dielectric layer 434 of FIG. 2C have the same thickness. Moreover, the total thicknesses of the ferroelectric materials of FIGS. 2A, 2B, and 2C are the same. For example, the total thicknesses of the ferroelectric materials of FIGS. 2A, 2B, and 2C are 15 nm.

FIG. 2D illustrates experiment results of memory devices including ferroelectric stacks 230, 330, 430 of FIGS. 2A, 2B, and 2C, respectively. In greater details, hysteresis loops L1, L2, L3 of FIG. 2D correspond to the experiment results of memory devices including ferroelectric stacks 230, 330, 430 of FIGS. 2A, 2B, and 2C, respectively. The results show that the memory devices including the ferroelectric stacks 330 and 430 of FIGS. 2B and 2C have greater memory window than the memory device including the ferroelectric stack 230 of FIG. 2A. More specifically, the memory device including the ferroelectric stack 430 of FIG. 2C has the largest memory window.

Based on the experiment results, it can be seen that when the ferroelectric material is too thick, such as the ferroelectric layer 232 (15 nm), the device performance may be degraded, such as the decreasing memory window as shown in FIG. 2D. This may be due to the ferroelectric layer 232 will gradually degrade its ferroelectricity when the thickness over 15-20 nm.

Figure 2E:
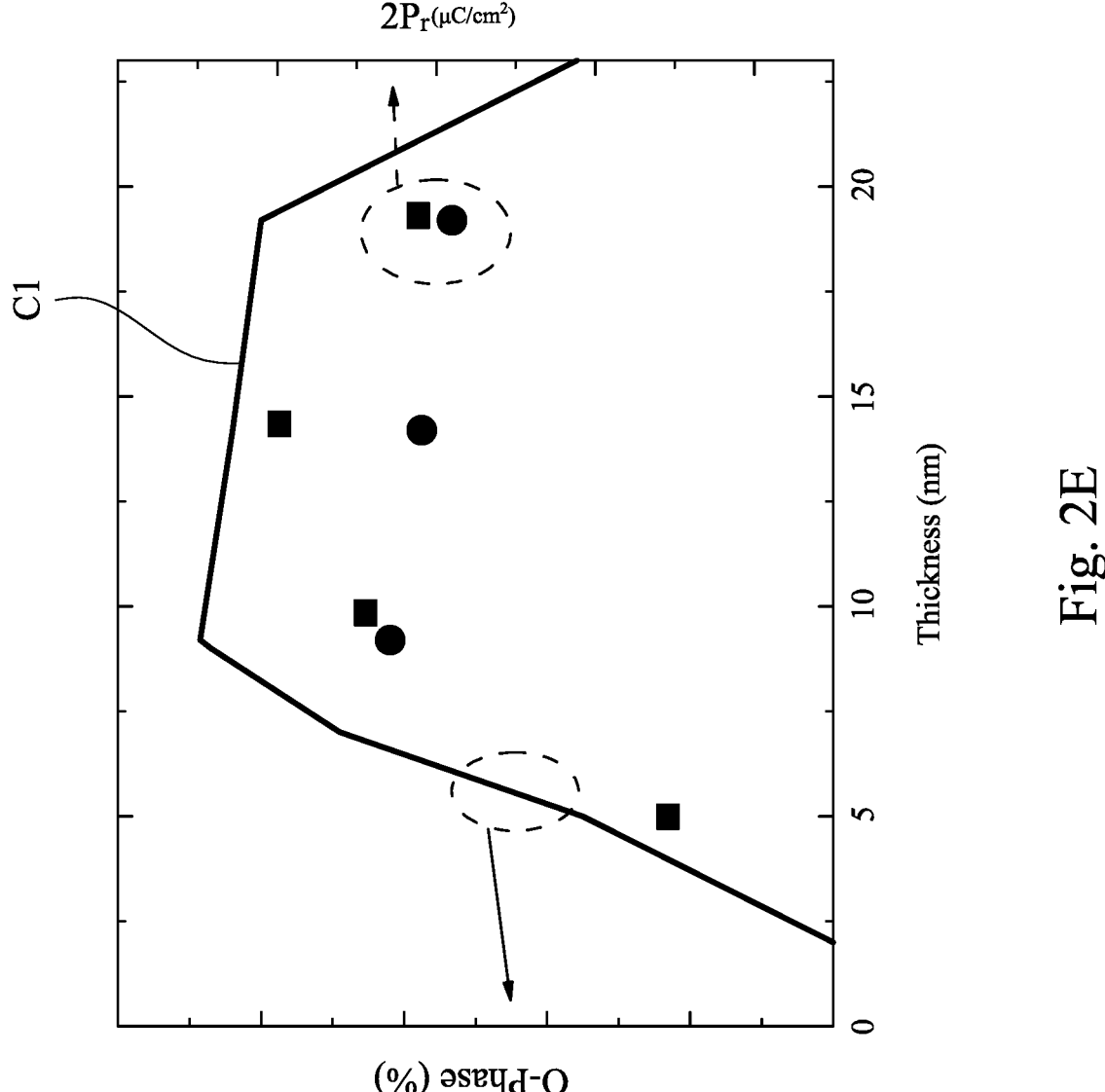
FIG. 2E illustrates experiment and simulation results of ferroelectric layer with different thicknesses in accordance with some embodiments of the present disclosure.

FIG. 2E illustrates experiment and simulation results of ferroelectric layer with different thicknesses. It can be seen that when the thickness of a ferroelectric layer is over 15-20 nm, the remanent polarization ($2Pr=Pr^+-Pr^-$) of the ferroelectric layer will decrease. Furthermore, when the thickness of a ferroelectric layer is less than 5 nm, the remanent polarization of the ferroelectric layer will decrease as well. The curve C1 is a simulation result calculated via first principle, it can be seen that when the thickness of the ferroelectric layer is in a range from about 10 nm to 15 nm, the ferroelectric layer exists over 80% orthorhombic (O—) phase (ferroelectric phase). However, when the thickness of the ferroelectric layer is less than 5 nm or over 15 nm, the ferroelectric layer will lose its ferroelectricity.

As a result, in the present disclosure, a thin dielectric layer is inserted between two ferroelectric layers to form a ferroelectric stack, the memory window can be improved without increasing the thickness of each ferroelectric layer.

Moreover, for the ferroelectric stack where the first ferroelectric layer is thicker than the second ferroelectric layer (e.g., the ferroelectric stack 430 of FIG. 2C), the memory window can be further improved. This is because the first ferroelectric layer may act as a base layer of the ferroelectric stack, if the first ferroelectric layer is too thin, the crystal quality of the first ferroelectric layer may be poor, and the device performance may not be satisfying. Accordingly, by forming a thicker first ferroelectric layer followed by a thinner second ferroelectric layer, the device performance can be further improved.

FIGS. 3 to 13 show various stages of a sequential manufacturing operation of an integrated circuit structure according to an embodiment of the present disclosure.

Figure 3:
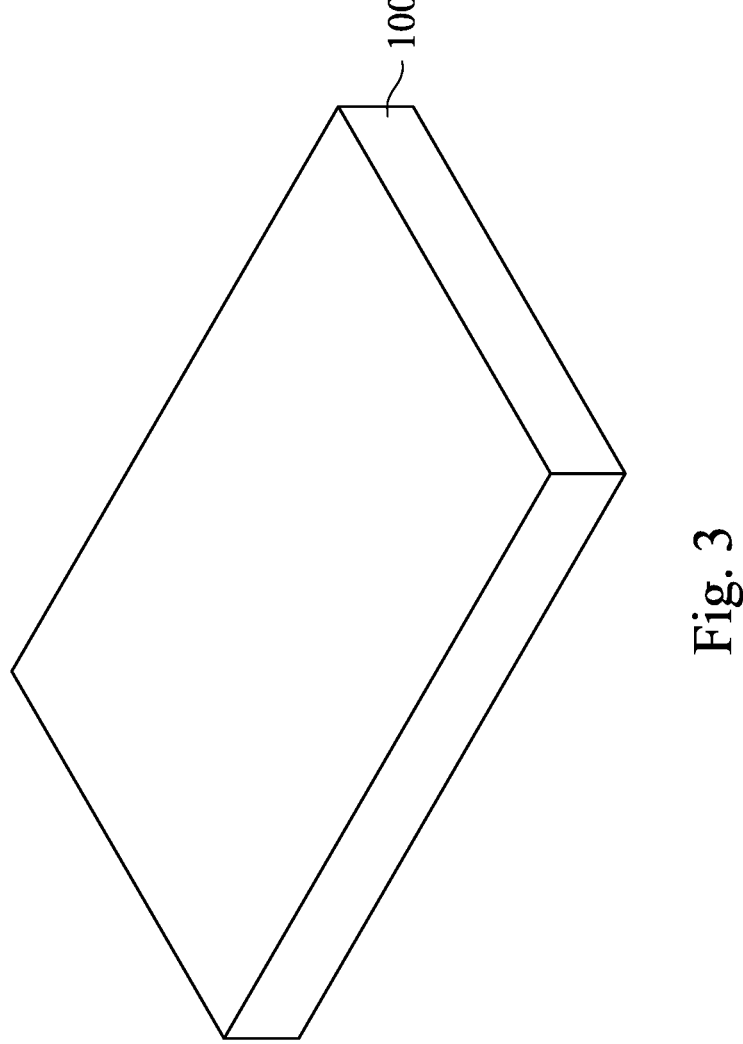
FIGS. 3 to 13 show various stages of a sequential manufacturing operation of an integrated circuit structure according to an embodiment of the present disclosure.

Reference is made to FIG. 3. A substrate 100 is provided. In some embodiments, the substrate 100 may be a semiconductor material and may include known structures including a graded layer or a buried oxide, for example. In some embodiments, the substrate 100 may include III-V compound semiconductor, such as GaAs, InP, GaN, InGaAs, InAlAs, or the like. In some embodiments, the substrate 100 may include IV semiconductor, such as silicon, geranium, or combinations thereof, which may be undoped or doped (e.g., p-type, n-type, or a combination thereof). Other materials that are suitable for semiconductor device formation may be used. Other materials, such as germanium, quartz, sapphire, and glass could alternatively be used for the substrate 100. Alternatively, the silicon substrate 100 may be an active layer of a semiconductor-on-insulator (SOI) substrate or a multi-layered structure such as a silicon-germanium layer formed on a bulk silicon layer. In some other embodiments, the substrate 100 may include transition-metal dichalcogenides (TMD).

Figure 4:
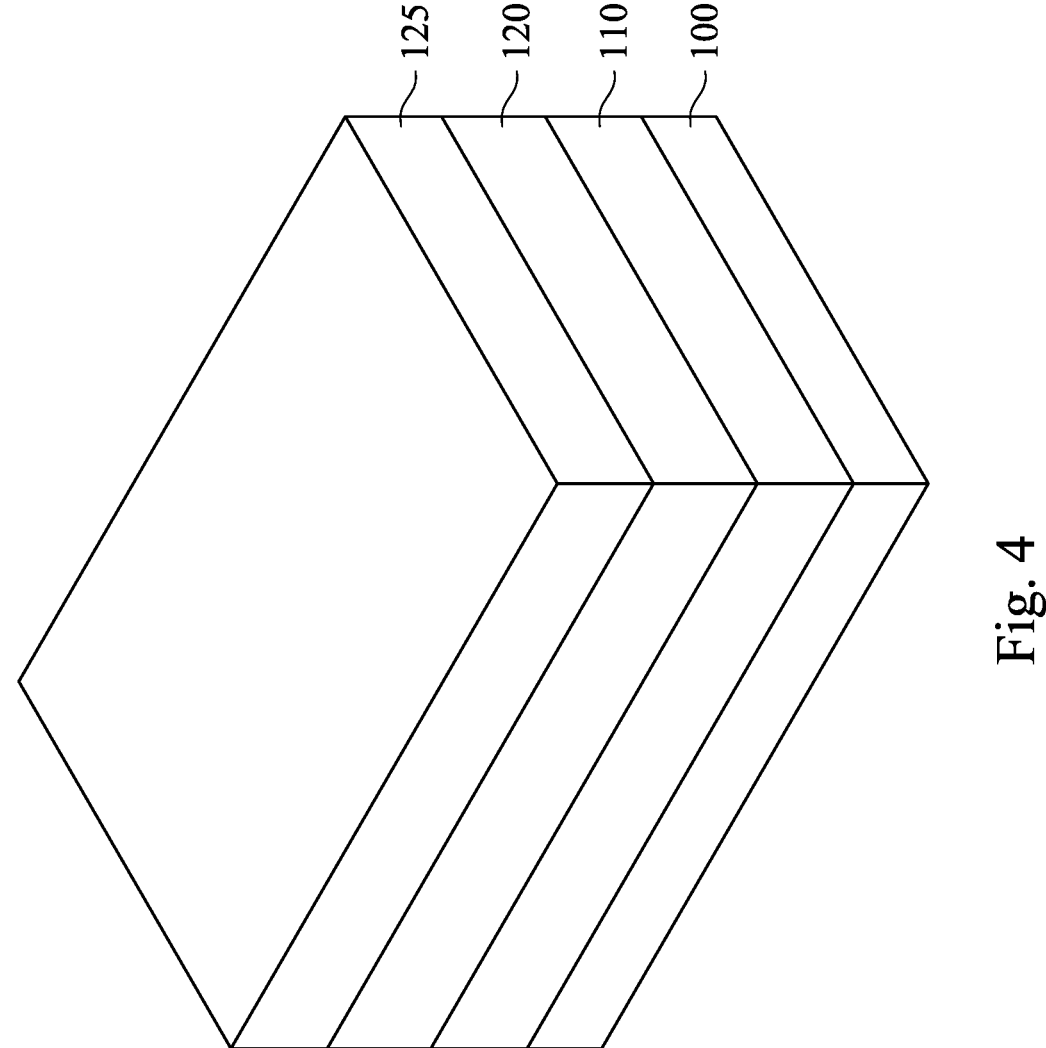

Reference is made to FIG. 4. A dielectric layer 110, a semiconductor layer 120, and a dielectric layer 125 are formed over the substrate 100. In some embodiments, the dielectric layers 110 and 125 are may include oxide, such as silicon oxide. In some other embodiments, the dielectric layers 110 and 125 may include nitride, such as silicon nitride. The dielectric layers 110 and 125 are made of a same material. In some embodiments, the semiconductor layer 120 may be made of silicon. In some embodiments, the semiconductor layer 120 may include poly silicon. The dielectric layer 110, a semiconductor layer 120, and a dielectric layer 125 may be formed by suitable deposition process, such as CVD, PVD, ALD, or the like.

Figure 5:
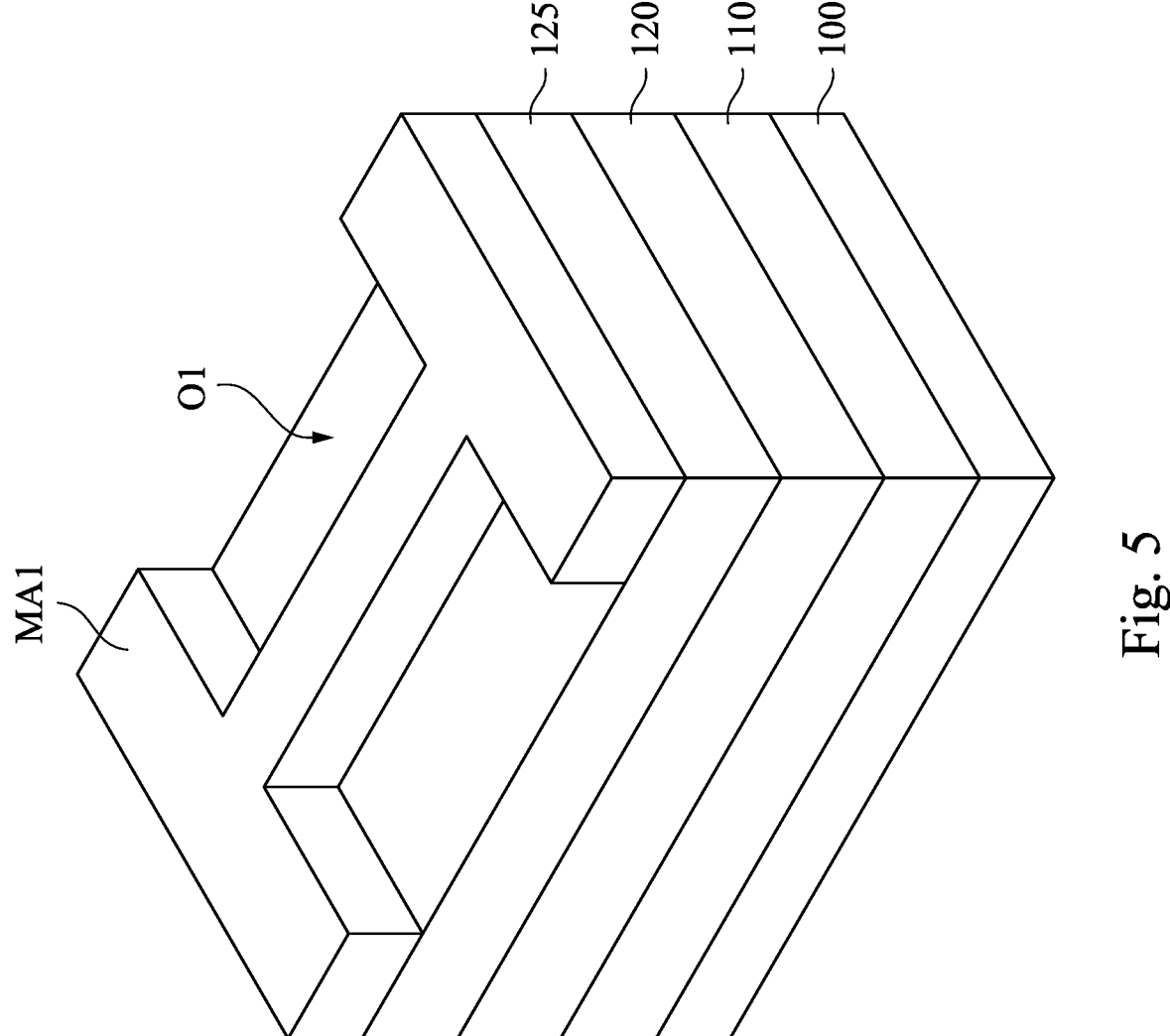

Reference is made to FIG. 5. A patterned mask MA1 is formed over the dielectric layer 125. In some embodiments, the patterned mask MA1 may include openings O1 that expose portions of the dielectric layer 125. The patterned mask MA1 may be a photoresist layer, and may be formed by suitable photolithography process.

Figure 6:
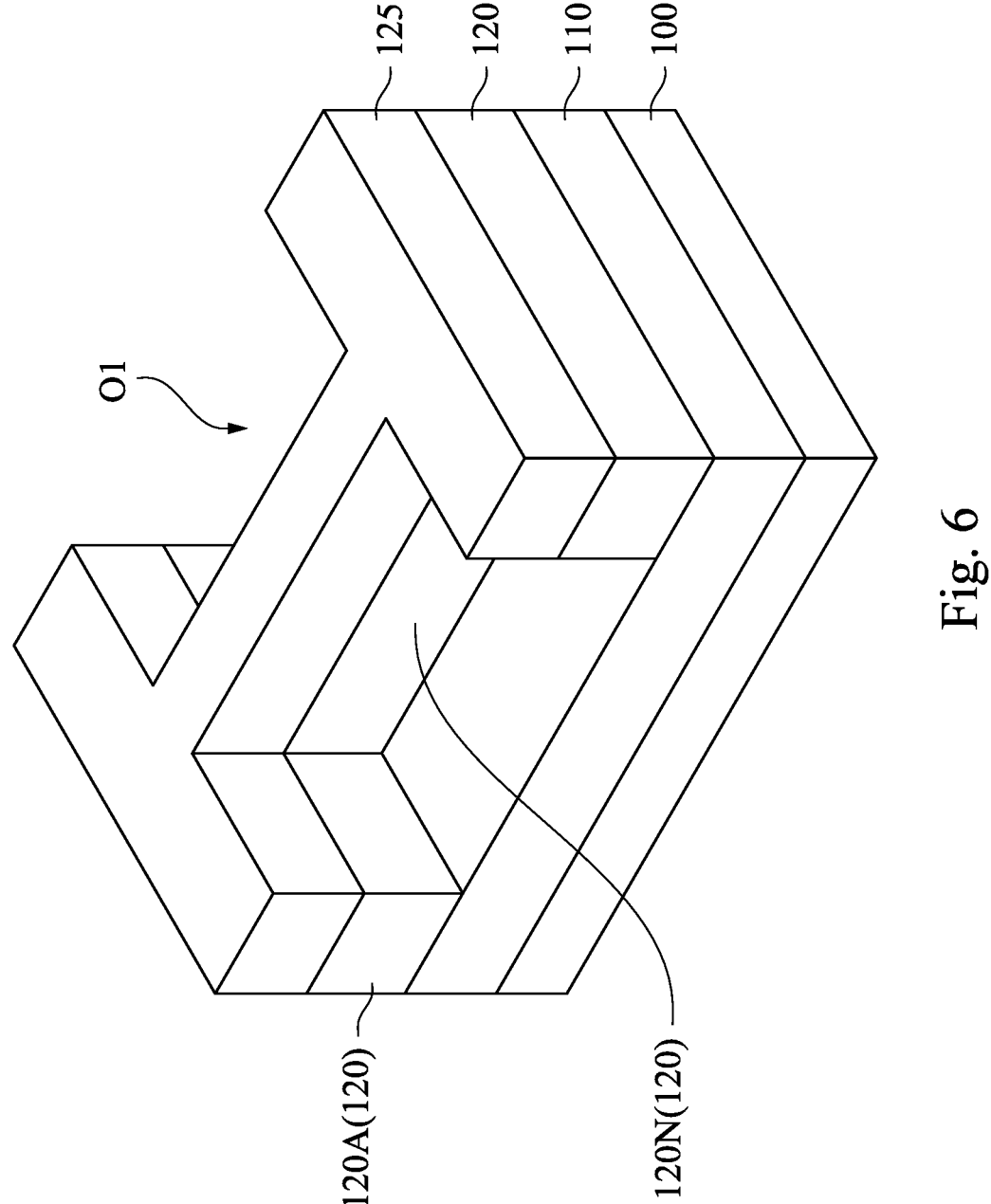

Reference is made to FIG. 6. The dielectric layer 125 and the semiconductor layer 120 are etched by using the patterned mask MA1 (see FIG. 5) as an etch mask, so as to transfer the pattern of the patterned mask MA1 to the dielectric layer 125 and the semiconductor layer 120. After the dielectric layer 125 and the semiconductor layer 120 are patterned, the patterned mask MA1 is removed from the top surface of the dielectric layer 125 by suitable process, such as striping or ashing. In some embodiments, the dielectric layer 125 and the semiconductor layer 120 are etched by using suitable etching process, such as dry etch or wet etch.

In some embodiments where the etching process is a dry etch, the dry etch may include plasma etching, and the etching process may stop at the dielectric layer 110. In some embodiments where the etching process is a wet etch, a first etching process using a first etchant is performed to etch the dielectric layer 125 through the openings O1 of the patterned mask MA1. The underlying semiconductor layer 120 may include higher etching resistance to the first etchant than the dielectric layer 125. Accordingly, the first etching process may stop at the semiconductor layer 120. Afterward, a second etching process using a second etchant is performed to etch the exposed portions of the semiconductor layer 120. The dielectric layers 110 and 125 may include higher etching resistance to the second etchant than the dielectric layer 125 than the semiconductor layer 120. Accordingly, the second etching process may stop at the dielectric layer 110.

As a result, the remaining semiconductor layer 120 includes the first portion 120A, the nanowire portion 120N, and the second portion 120B as discussed in FIGS. 1A to 1D. In some embodiments, the top surface and the sidewalls of the nanowire portion 120N of the semiconductor layer 120 are exposed, while the bottom surface of the nanowire portion 120N of the semiconductor layer 120 is covered by the underlying dielectric layer 110.

Figure 7:
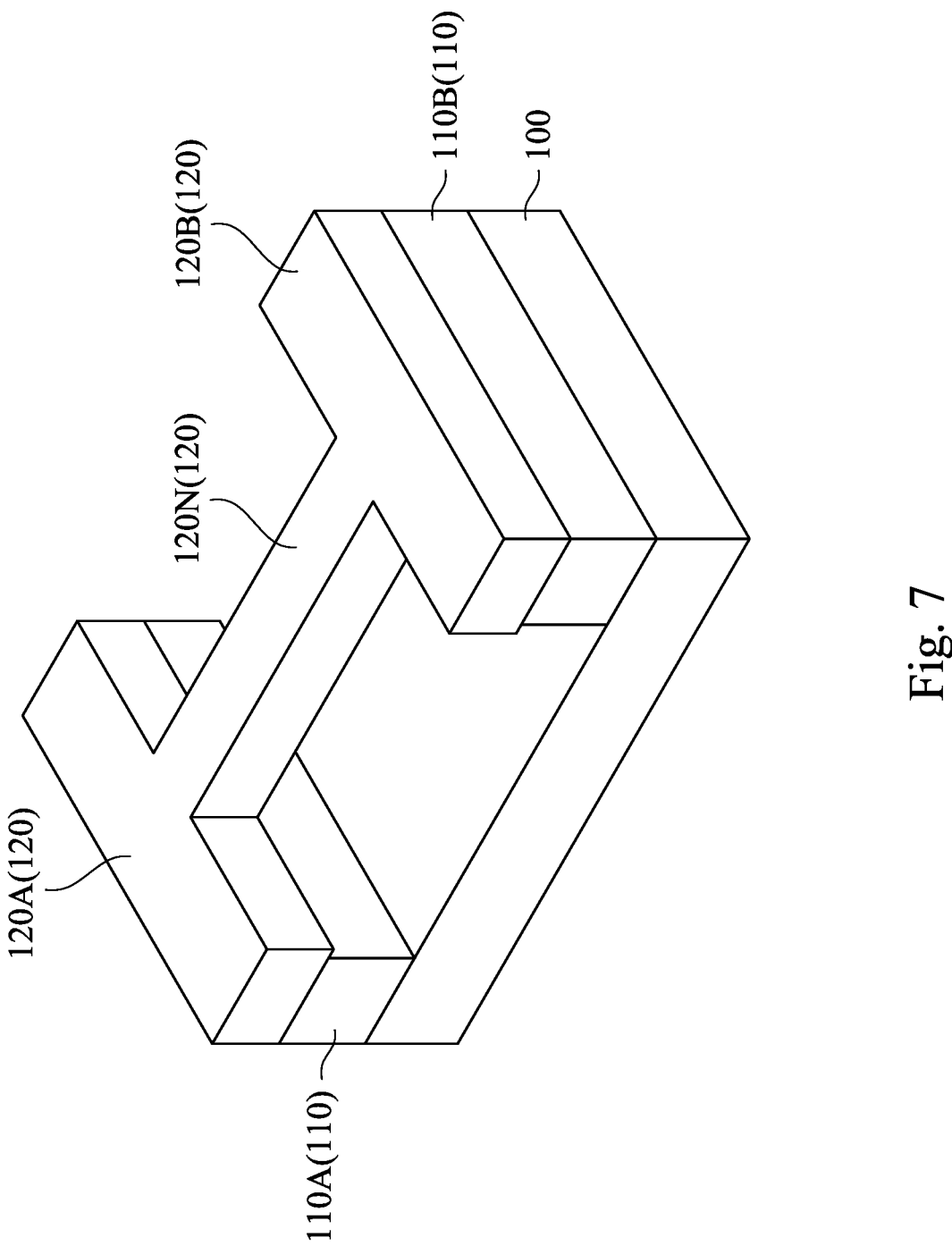

Reference is made to FIG. 7. An etching process is performed to remove the dielectric layer 125 from the top surface of the semiconductor layer 120, and is performed to etch the underlying dielectric layer 110 by using the semiconductor layer 120 as an etch mask.

In some embodiments, the dielectric layers 110 and 125 are etched by using suitable etching process, such as dry etch or wet etch. During the etching process, the semiconductor layer 120 may include higher etching resistance to the etchant than the dielectric layers 110.

In some embodiments, the etching process discussed in FIG. 6 may be a dry etch, while the etching process discussed in FIG. 7 may be a wet etch process. Stated another way, the etching process discussed in FIG. 6 may be an anisotropic, while the etching process discussed in FIG. 7 may be isotropic.

In some embodiments where the etching process is a wet etch, the underlying dielectric layer 110 may be slightly over-etched, such that portions of the dielectric layer 110 may be removed from the bottom surface of the nanowire portion 120N of the semiconductor layer 120. Accordingly, after the etching process, the bottom surface of the nanowire portion 120N of the semiconductor layer 120 is exposed, and the nanowire portion 120N of the semiconductor layer 120 is therefore suspended over the substrate 100. The resultant dielectric layer 110 may have sidewalls laterally set back from respective sidewalls of the semiconductor layer 120 due to the etching, as illustrated in FIG. 7.

As a result, the remaining dielectric layer 110 includes the first portion 110A and the second portion 110B as discussed in FIGS. 1A to 1D. In some embodiments, as a result of the wet etching for the dielectric layer 110, sidewalls of the first portion 110A and the second portion 110B of the dielectric layer 110 may be slightly pulled back, and may be mis-aligned with the sidewalls of the first portion 120A and the second portion 120B of the semiconductor layer 120, respectively. Accordingly, bottom surfaces of the first portion 120A and the second portion 120B of the semiconductor layer 120 may be exposed.

Figure 8A:
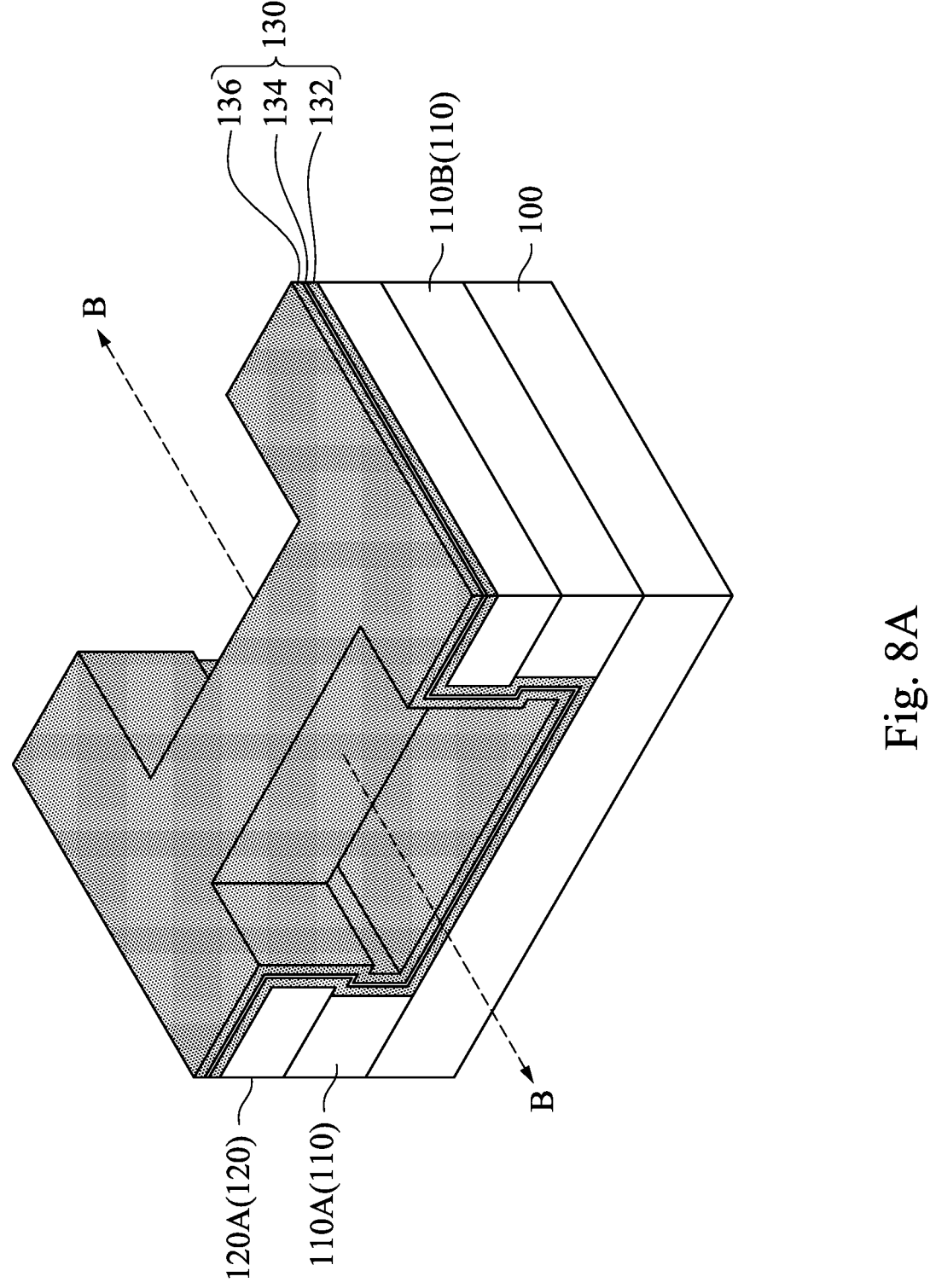
Figure 8B:
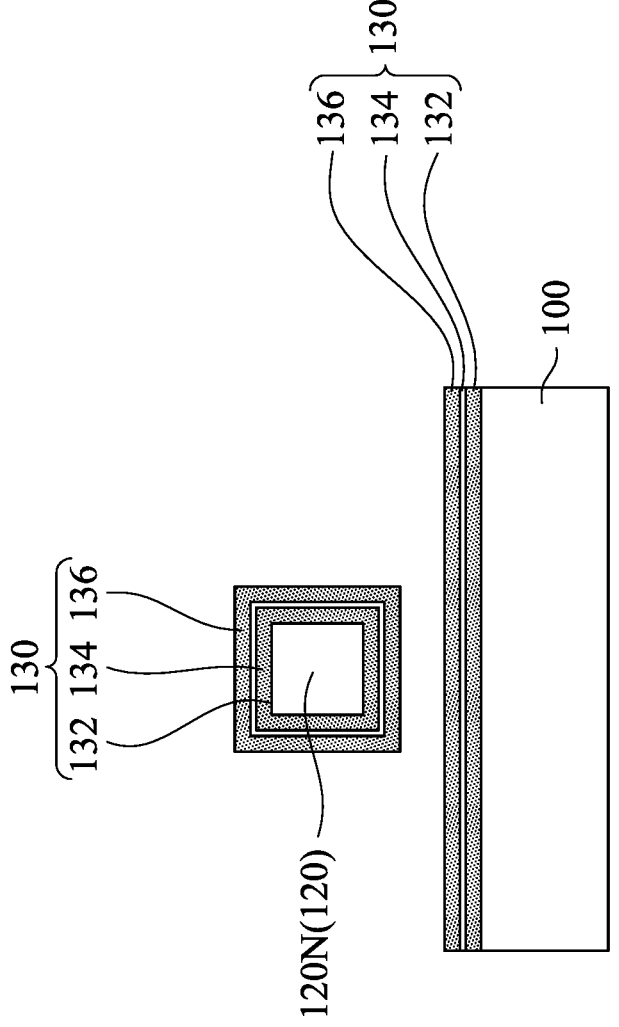

Reference is made to FIGS. 8A and 8B, in which FIG. 8B is a cross-sectional view along line B-B of FIG. 8A. A ferroelectric stack 130 is formed blanket over the substrate 100. In greater details, the ferroelectric stack 130 is formed covering the exposed surfaces of the structure of FIG. 7.

For example, with respect to the semiconductor layer 120, the top surface, the sidewalls, and the bottom surface of the nanowire portion 120N of the semiconductor layer 120 are covered by the ferroelectric stack 130. Top surface, sidewall, and a portion of the bottom surface of the first portion 120A of the semiconductor layer 120 are covered by the ferro-electric stack 130. Similarly, top surface, sidewall, and a portion of the bottom surface of the second portion 120B of the semiconductor layer 120 are covered by the ferroelectric stack 130. With respect the dielectric layer 110, sidewalls of the first portion 110A and the second portion 110B of the dielectric layer 110 are covered by the ferroelectric stack 130. With respect to the substrate 100, a portion of the top surface of the substrate 100 is covered by the ferroelectric stack 130.

The ferroelectric stack 130 includes a first ferroelectric layer 132, a dielectric layer 134 over the first ferroelectric layer 132, and the second ferroelectric layer 136 over the dielectric layer 134.

In some embodiments, the first ferroelectric layer 132 and the second ferroelectric layer 136 may be or include, for example, strontium bismuth tantalite (e.g., SBT), lead zir-conate titanate (e.g., PZT), hafnium zirconium oxide (e.g., $HfZrO_2$; HZO), doped hafnium oxide (e.g., Si:HfO2), HAO (Al-Doped $HfO_2$), HSO (Si-Doped $HfO_2$), some other suit-able ferroelectric material(s), or any combination of the foregoing. In some embodiments where the first ferroelectric layer 132 and the second ferroelectric layer 136 are made of $HfZrO_2$ (HZO), the atomic percentage of Zr atoms is in a range from about 40% to about 60%, such as 50%.

In some embodiments, the first ferroelectric layer 132 and the second ferroelectric layer 136 are made of high-k mate-rial, and thus the first ferroelectric layer 132 and the second ferroelectric layer 136 can also be referred to as high-k ferroelectric layers. In some embodiments, the dielectric constants of the first ferroelectric layer 132 and the second ferroelectric layer 136 are higher than dielectric constant of the dielectric layer 134.

In some embodiments, the dielectric layer 134 may be made of oxide, such as aluminum oxide ($Al_2O_3$), silicon oxide ($SiO_2$).

The first ferroelectric layer 132, the dielectric layer 134, and the second ferroelectric layer 136 may be formed by suitable deposition process, such as CVD, PVD, ALD, or the like.

Figure 8C:
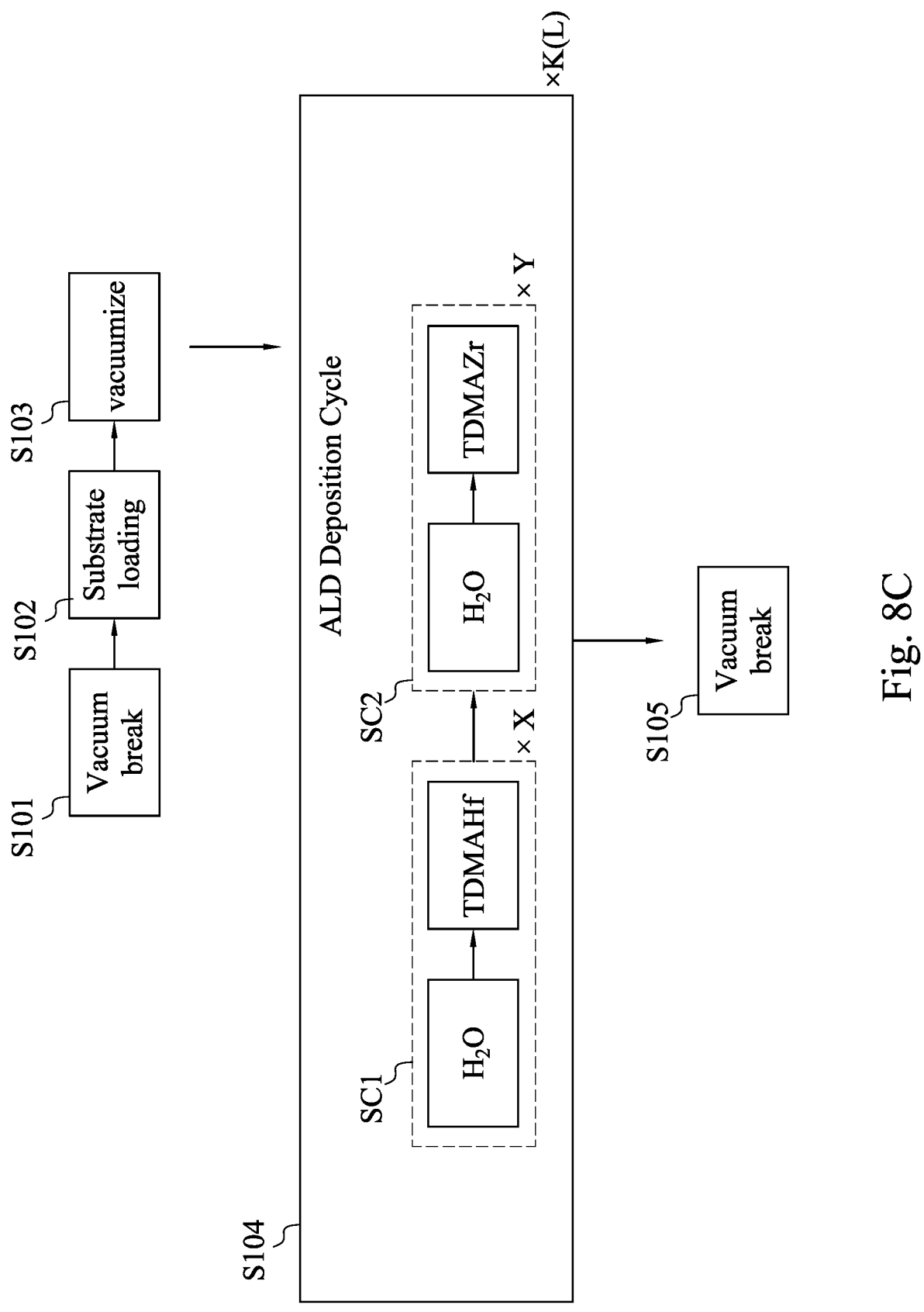

FIG. 8C illustrates a method for forming the first ferro-electric layer 132 and the second ferroelectric layer 136. In greater detail, FIG. 8C illustrates a method for forming the first ferroelectric layer 132 and the second ferroelectric layer 136 made of $Hf_{0.5}Zr_{0.5}O_2$ using an ALD process.

In block S101, a first vacuum break process is performed in an ALD chamber. The vacuum break process indicates a process in which a space (e.g., the chamber) is controlled under the atmospheric pressure. In some embodiments, a vacuum controlled break valve (not shown) may be provided to control of gas (e.g., air) entering the chamber, such that the chamber is in under the atmospheric pressure.

In block S102, a substrate is loaded into the ALD cham-ber. For example, the substrate may be the substrate 100 including the structure formed thereon, as shown in FIG. 7.

In block S103, the ALD chamber is vacuumized. In greater detail, after the substrate is loaded into the ALD chamber, the chamber, in which the ALD deposition takes place, is maintained under vacuum using a suitable vacuum pump (not shown). In some embodiments, a vacuum port is provided for evacuating air from the chamber.

In block S104, an ALD deposition is performed. In some embodiments, each ALD deposition cycle includes several sub-cycles. For example, as shown in block S104, each ALD deposition cycle includes a first sub-cycle SC1 and a second sub-cycle SC2. In some embodiments, the second sub-cycle SC2 is performed after the first sub-cycle SC1. In some other embodiments, the second sub-cycle SC2 may be performed prior to the first sub-cycle SC1.

The first sub-cycle SC1 includes an ALD deposition by supplying precursors of $H_2O$ and tetrakis(dimethylamino) hafnium ($Hf[N(CH_3)_2]_4$; TDMAHf) into the ALD chamber. In some embodiments, the first sub-cycle SC1 may be performed under temperature in a range from about 200° C. to about 300° C., a pressure of $H_2O$ in a range from about 1 mtorr to about 120 mtorr, and a pressure of TDMAHf in a range from about 1 mtorr to about 60 mtorr.

The second sub-cycle SC2 includes an ALD deposition by supplying precursors of $H_2O$ and tetrakis(dimethylamino) zirconium ($Zr[N(CH_3)_2]4$); TDMAZr) into the ALD cham-ber. In some embodiments, the second sub-cycle SC2 may be performed under temperature in a range from about 200° C. to about 300° C., a pressure of $H_2O$ in a range from about 1 mtorr to about 120 mtorr, and a pressure of TDMAZr in a range from about 1 mtorr to about 60 mtorr.

The first sub-cycle SC1 has different precursors than the second sub-cycle SC2. For example, the precursors of the first sub-cycle SC1 includes hafnium (Hf) and does not include zirconium (Zr), while the precursors of the second sub-cycle SC2 includes zirconium (Zr) and does not include hafnium (Hf).

In each ALD deposition cycle, the first sub-cycle SC1 is performed X time(s), the second sub-cycle SC2 is performed Y time(s). In some embodiments, X:Y is 1:1. For example, each ALD cycle includes performing the first sub-cycle SC1 for one time, and then performing the second sub-cycle SC2 for one time after performing the first sub-cycle SC1 for one time. This will result in that the atomic percentages of Hf and Zr are about 50% and 50%, respectively.

In some embodiments, the ALD deposition may include performing ALD deposition cycle for K times to achieve a desired thickness of the first ferroelectric layer 132, and may include performing ALD deposition cycle for L times to achieve a desired thickness of the second ferroelectric layer 136. In some embodiments, K and L are in a range from about 25 to 50 (e.g., 25), and the resulting thicknesses of the first ferroelectric layer 132 and the second ferroelectric layer 136 are in a range from about 5 nm to about 10 nm (e.g., about 10 nm).

In some embodiments, K is equal to L, and thus the first ferroelectric layer 132 and the second ferroelectric layer 136 may include substantially a same thickness. In some other embodiments, K is greater than L, and thus the first ferro-electric layer 132 will be thicker than the second ferroelec-tric layer 136. In some embodiments, K is not less than L to ensure that the first ferroelectric layer 132 is thicker than the second ferroelectric layer 136.

In block S105, after the ALD deposition, a second vacuum break process is performed. That is, the pressure in the chamber is adjusted from vacuum to the atmospheric pressure.

Figure 9:
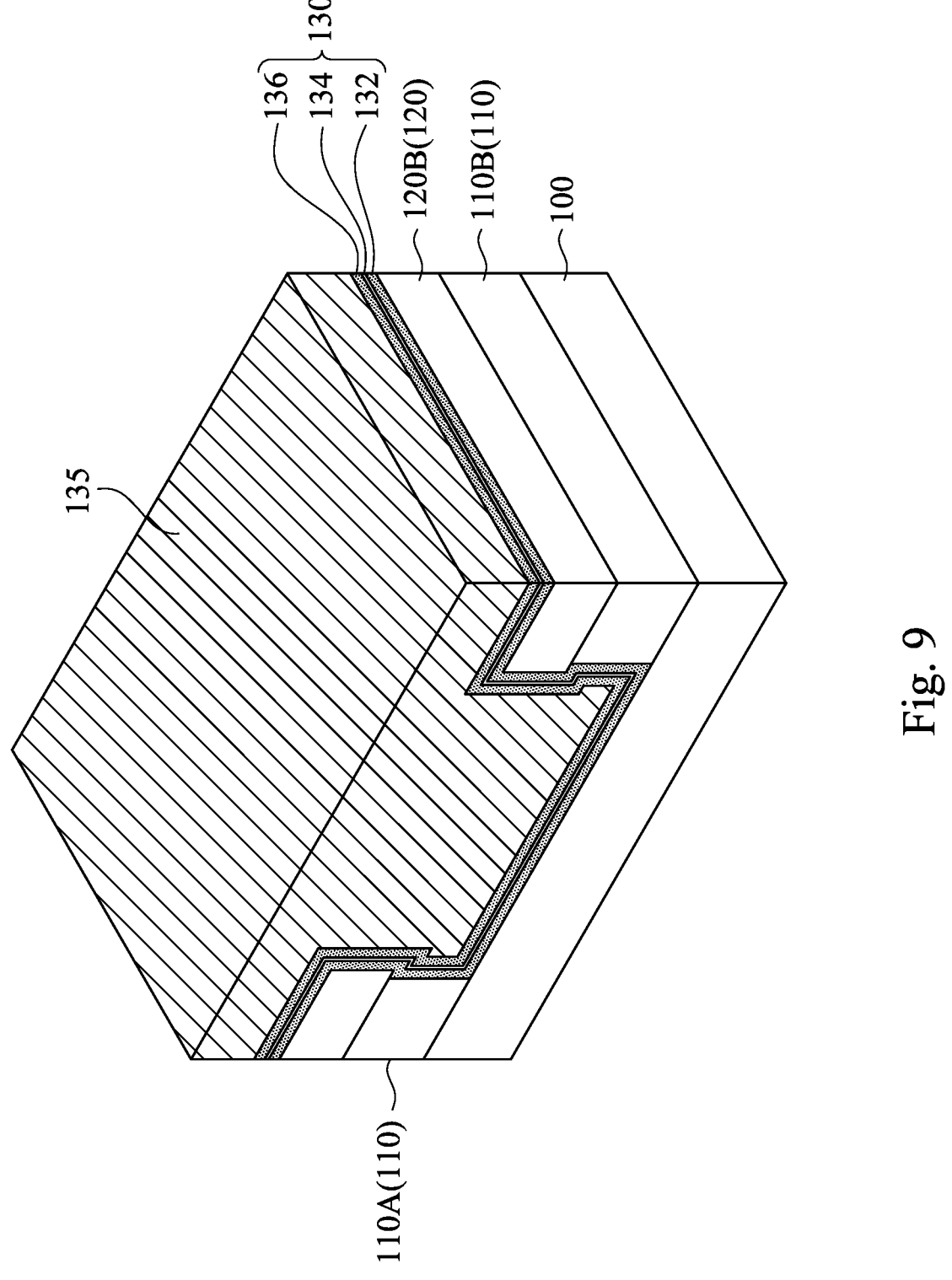

Reference is made to FIG. 9. A gate metal layer 135 is deposited over the substrate 100 and covering the ferroelectric stack 130. In some embodiments, at least portions of the gate metal layer 135 extend to positions that are vertically below the first portion 120A and the second portion 120B of the semiconductor layer 120. In some embodiments, the gate metal layer 135 may be formed by suitable deposition process, such as CVD, PVD, ALD, sputtering, or the like. In some embodiments, the gate metal layer 135 may be made of TaN, TiN, W, Pt, Mo, Ta, Ti, Silicide, or combinations thereof.

Figure 10:
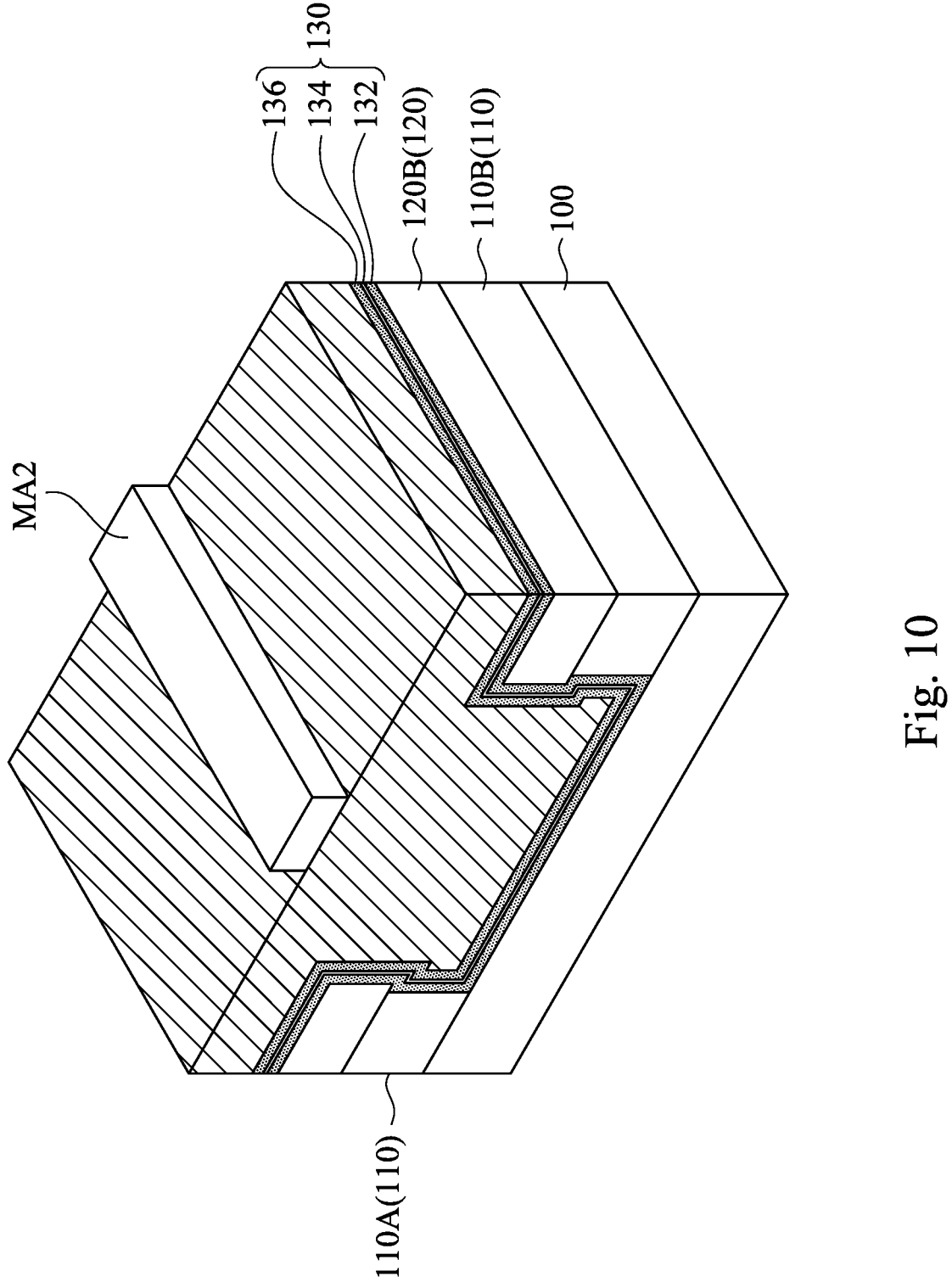

Reference is made to FIG. 10. A patterned mask MA2 is formed over the gate metal layer 135. The patterned mask MA2 may be a photoresist layer, and may be formed by suitable photolithography process. The patterned mask MA2 may define the position of the gate structure formed in later step (e.g., the gate structure 150 of FIG. 11).

Figure 11:
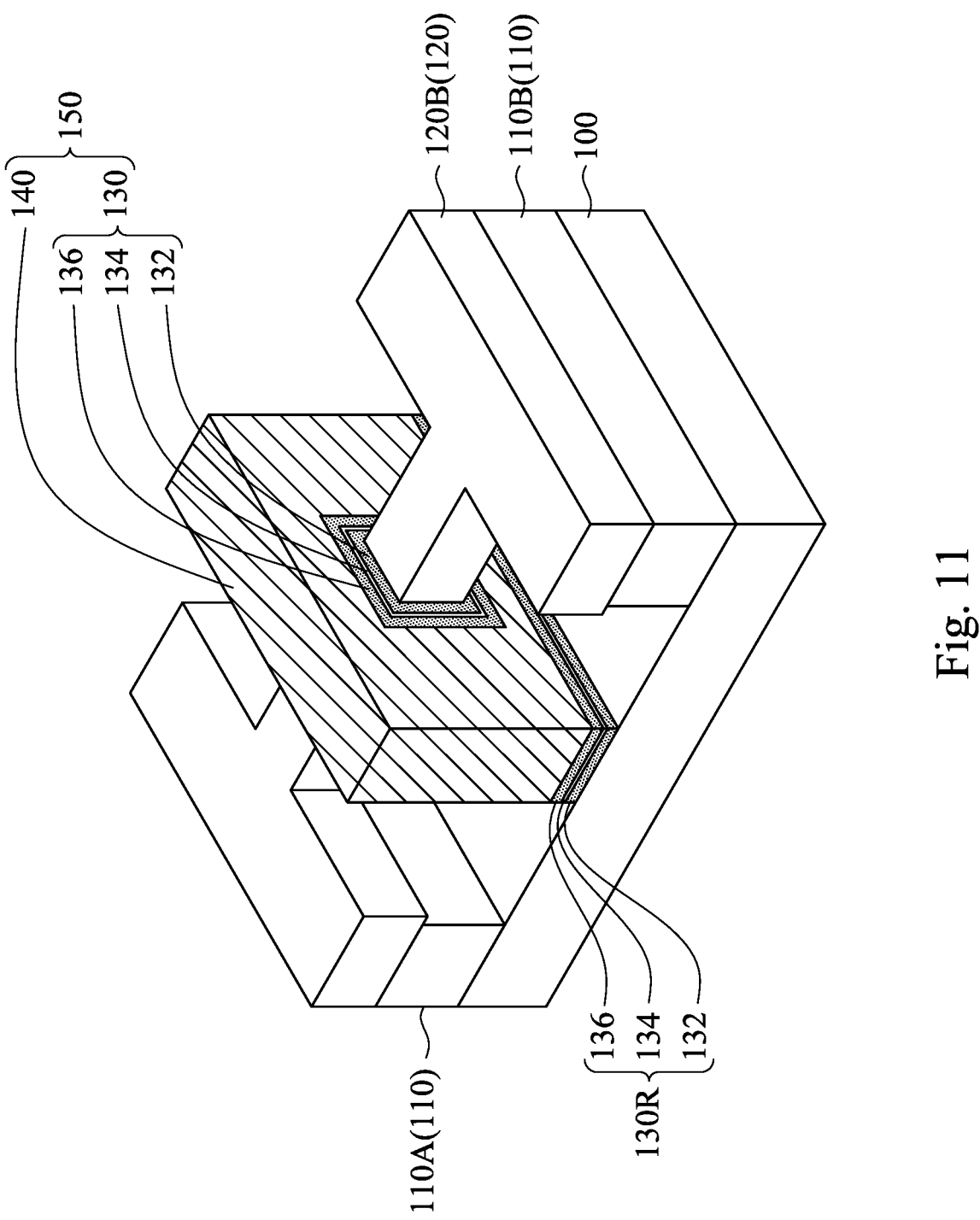

Reference is made to FIG. 11. The gate metal layer 135 and the ferroelectric stack 130 are etched by using the patterned mask MA2 as an etch mask. As a result, the remaining portion of the gate metal layer 135 is referred to as gate metal 140. Furthermore, the gate metal 140 and the remaining ferroelectric stack 130 can be collectively referred to as a gate structure 150, which wraps around the channel region 124 of the semiconductor layer 120. In some embodiments, gate metal layer 135 and the ferroelectric stack 130 are etched by using suitable etching process, such as dry etch or wet etch. For example, the dry etch may include plasma etching.

In some embodiments, after the gate metal layer 135 and the ferroelectric stack 130 are patterned, the first ferroelectric layer 132, the dielectric layer 134, and the second ferroelectric layer 136 may include remaining portions under the gate metal 140. This is because the gate structure 150 may act as a mask that protects the underlying first ferroelectric layer 132, the dielectric layer 134, and the second ferroelectric layer 136. The remaining portions of the first ferroelectric layer 132, the dielectric layer 134, and the second ferroelectric layer 136 under the gate metal 140 can be collectively referred to as a remaining portion 130R. In some embodiments, gate metal 140 is vertically separated from the substrate 100 by the remaining portion 130R.

After the gate structure 150 is formed, an implantation process may be performed to the exposed portions of the semiconductor layer 120 to form source/drain regions 122. In some embodiments, the gate structure 150 may serve as a protective mask such that the dopants of the implantation process may not be driven into the channel region 124 of the semiconductor layer 120. In some embodiments, the source/drain regions 122 have a conductivity type different from a conductivity type of the channel region 124 of the nanowire portion 120N of the semiconductor layer 120.

After the implantation process is completed, an annealing process may be performed to activate the dopants of the source/drain regions 122. In some embodiments, the annealing process may include rapid thermal annealing (RTA), laser spike annealing (LSA), furnace annealing, flash anneal, microwave annealing, or the like. In some embodiments where the annealing process is RTA, the temperature of the annealing process is in a range from about 500° C. to about 1000° C., the pressure of the annealing process is in a range from about 0.001 atm to about 1 atm. In some embodiments, the annealing process may be performed in a gas environment that would not react with the structure, such as $N_2$, Ar, He, Ne, Kr, Xe, Rn, or the like.

Figure 12:
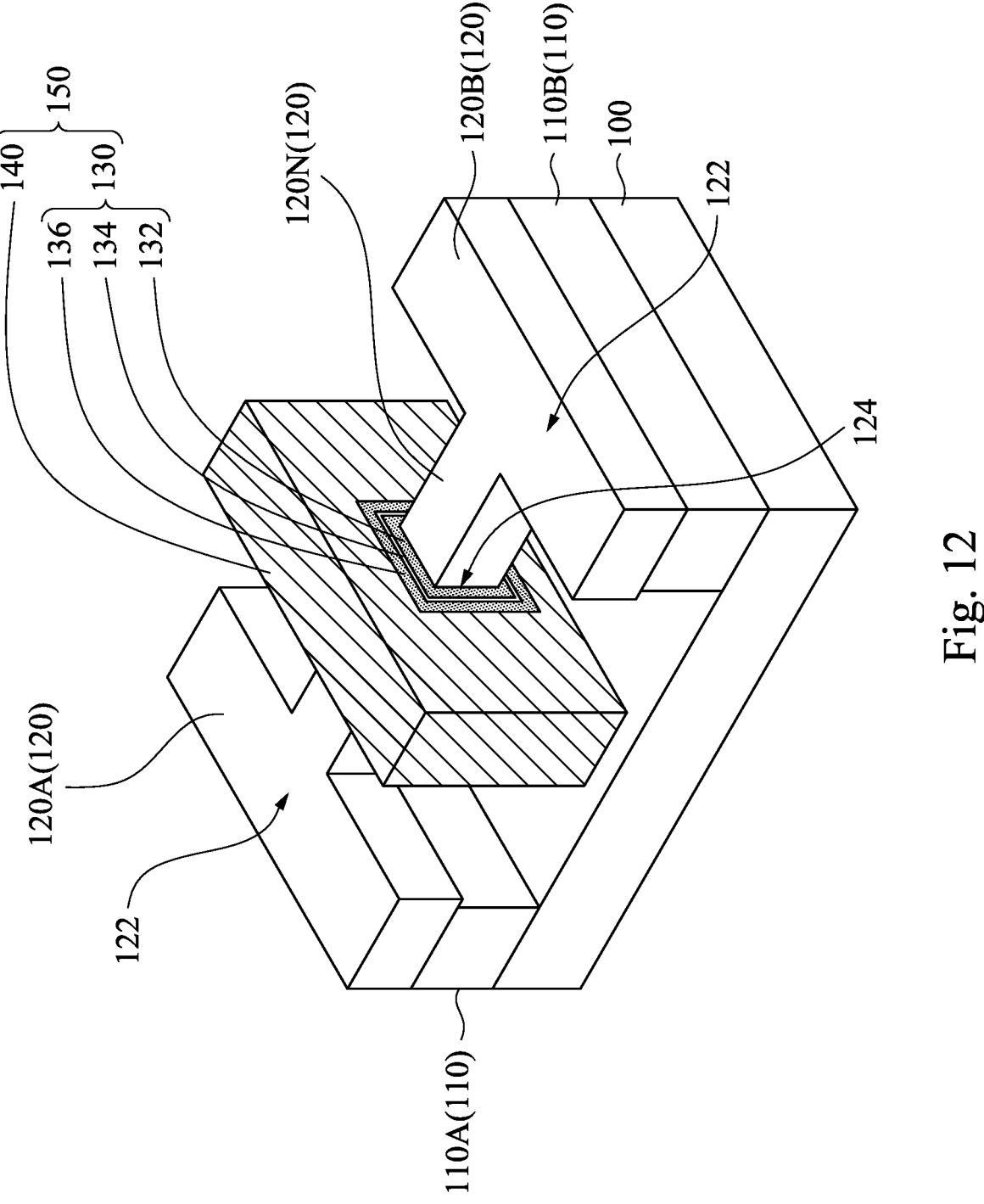

Reference is made to FIG. 12. An etching process is performed to remove the remaining portion 130R of the first ferroelectric layer 132, the dielectric layer 134, and the second ferroelectric layer 136. After the remaining portion 130R is removed, a gap is formed vertically between the gate structure 150 and the substrate 100. Stated another way, after the remaining portion 130R is removed, the gate structure 150 is suspended over the substrate 100. In some embodiments, the etching process may include a wet etch.

Figure 13:
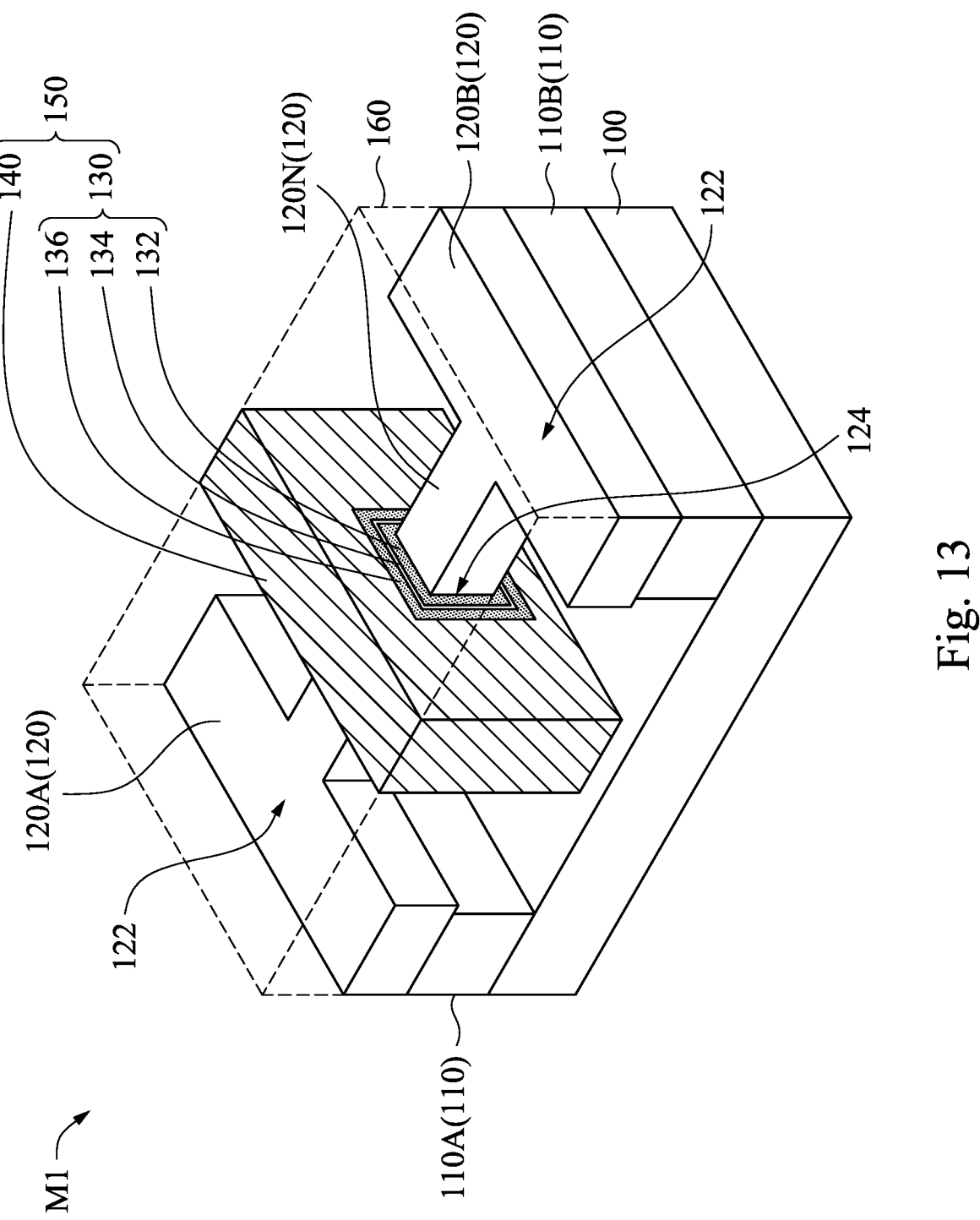

Reference is made to FIG. 13. An interlayer dielectric (ILD) layer 160 is formed over the substrate 100. In some embodiments, the ILD 160 may be formed of a dielectric material, and may be deposited by any suitable method, such as CVD, plasma-enhanced CVD (PECVD), or FCVD. A chemical mechanism polishing (CMP) process may be performed to remove excess material of the ILD layer 160 until the gate structure 150 is exposed.

In some embodiments, the ILD layer 160 may be in contact with the ferroelectric stack 130 of the gate structure 150. In some embodiments, the ILD layer 160 may fill the gap vertically between the gate structure 150 and the substrate 100, and thus the ILD layer 160 may include a portion that is vertically between the gate structure 150 and the substrate 100, and the portion is in contact with the bottom surface of the gate structure 150.

Figure 14:
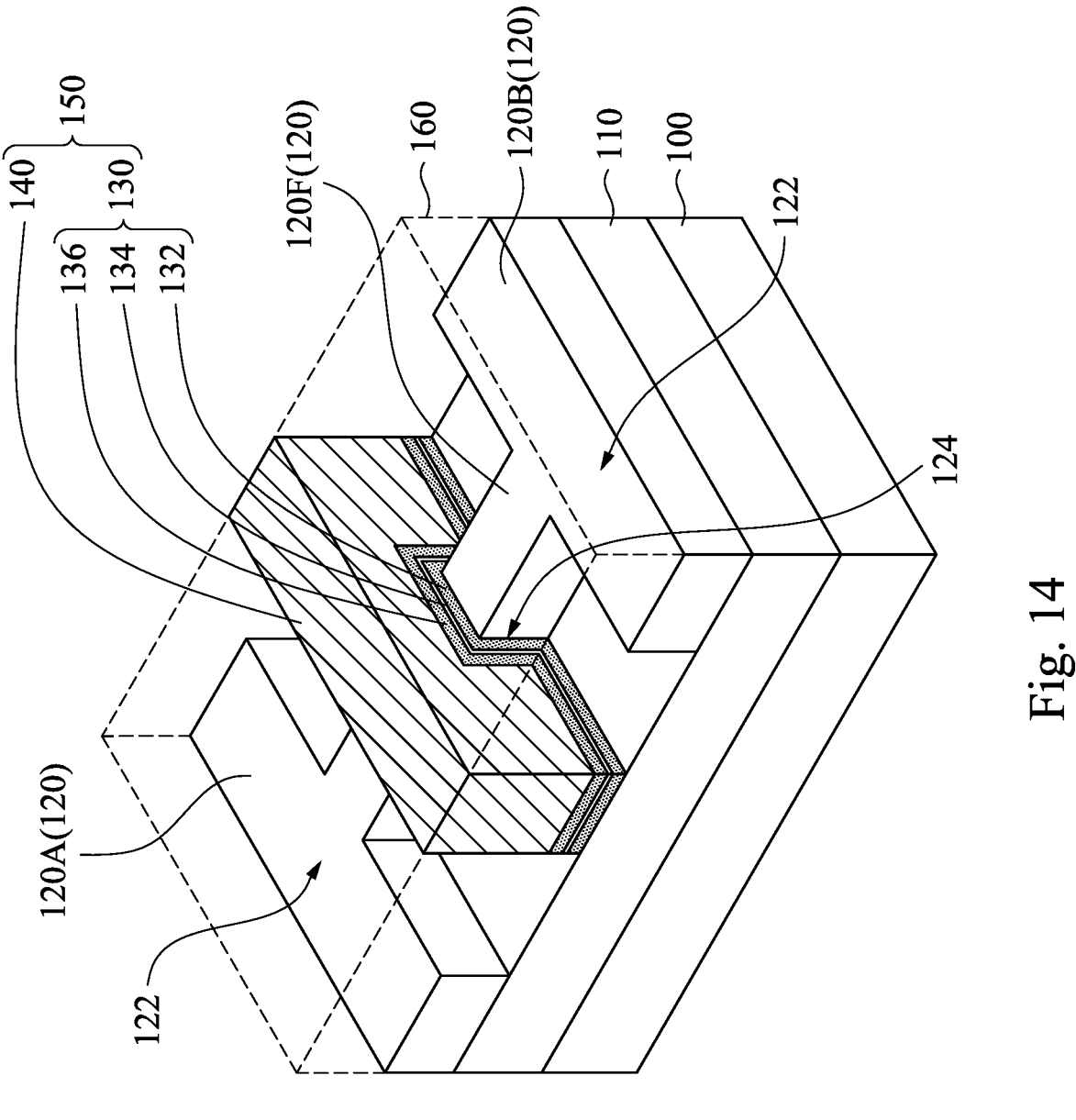
FIG. 14 illustrates a schematic view of a memory device in accordance with some embodiments of the present disclosures.

FIG. 14 illustrates a schematic view of a memory device in accordance with some embodiments of the present disclosures. Some elements of FIG. 14 may be similar to those as described in FIGS. 1A to 13, such elements are labeled the same, and relevant details will not be repeated for brevity.

FIG. 14 illustrates a memory device M2, the memory device M2 is different from the memory device M1 of FIG. 1A, in that the memory device M2 of FIG. 14 has a Fin-type structure. For example, the semiconductor layer 120 may include a semiconductor fin 120F disposed over the dielectric layer 110. In some embodiments, the semiconductor fin 120F may be formed over the dielectric layer 110 by patterning the semiconductor layer 120.

The gate structure 150 is disposed over the substrate 100 and crossing the semiconductor fin 120F. That is, the gate structure 150 may be in contact with top surface and opposite sidewalls of the semiconductor fin 120F, and may be further in contact with top surface of the dielectric layer 110 that is not covered by the semiconductor layer 120.

In some embodiments, the gate structure 150 can be formed by the method as described in FIGS. 8A to 11. For example, the first ferroelectric layer 132, the dielectric layer 134, the second ferroelectric layer 136, and the gate metal layer 135 may be deposited blanket over the semiconductor fin 120F, and then be patterned according to a predetermined pattern to form the gate structure 150. In particular, the ferroelectric stack 130 can be formed by the method as described in FIGS. 8A to 8C, while relevant details will not be repeated for brevity.

Figure 15:
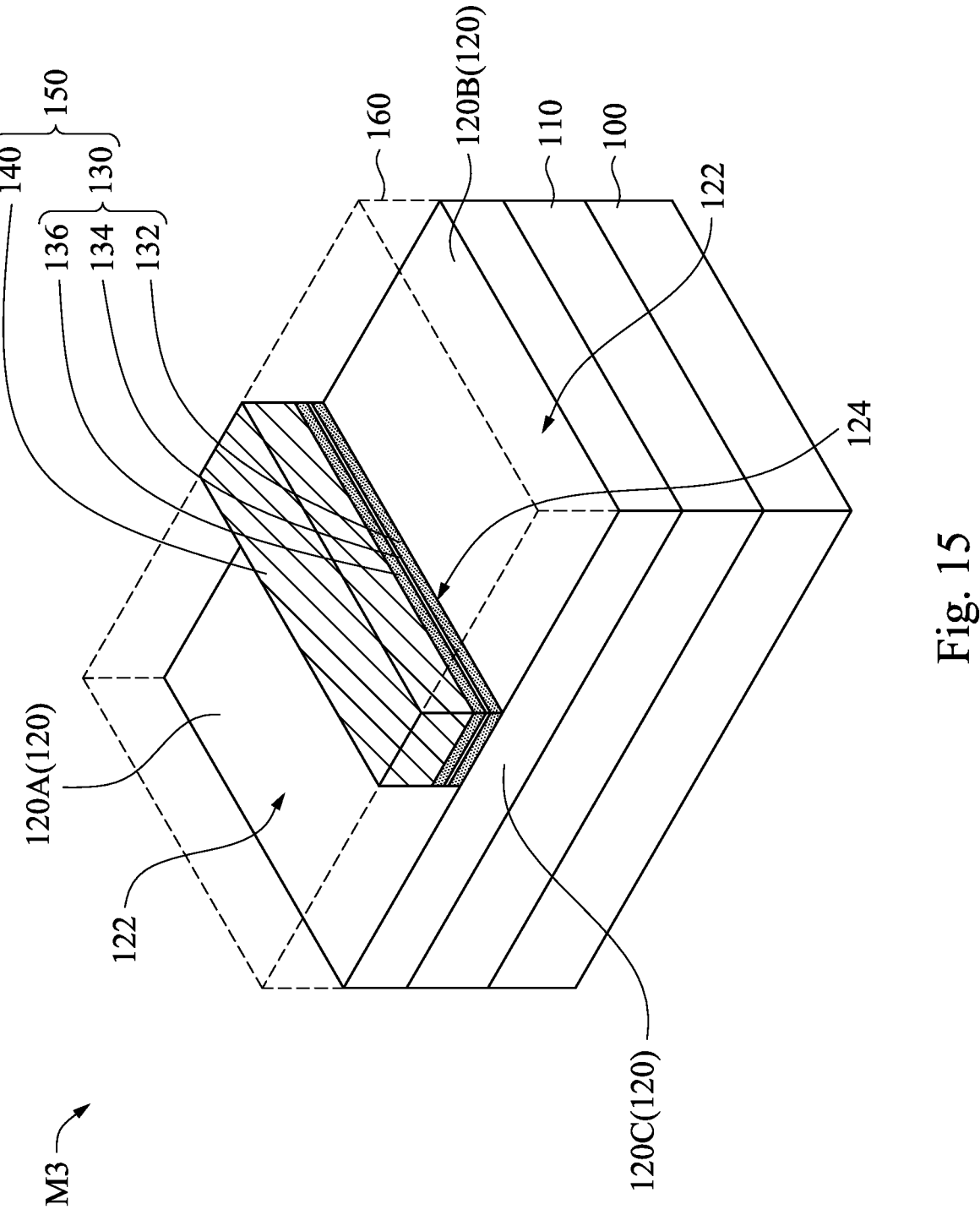
FIG. 15 illustrates a schematic view of a memory device in accordance with some embodiments of the present disclosures.

FIG. 15 illustrates a schematic view of a memory device in accordance with some embodiments of the present disclosures. Some elements of FIG. 15 may be similar to those as described in FIGS. 1A to 13, such elements are labeled the same, and relevant details will not be repeated for brevity.

FIG. 15 illustrates a memory device M3, the memory device M3 is different from the memory device M1 of FIG. 1A, in that the memory device M3 of FIG. 15 has a planar structure. For example, the semiconductor layer 120 is disposed over the dielectric layer 110 and has a substantially flat top surface.

The gate structure 150 is disposed over a portion 120C of the semiconductor layer 120. That is, the gate structure 150 may be in contact with only one side of the semiconductor layer 120.

In some embodiments, the gate structure 150 can be formed by the method as described in FIGS. 8A to 11. For example, the first ferroelectric layer 132, the dielectric layer 134, the second ferroelectric layer 136, and the gate metal layer 135 may be deposited blanket over the semiconductor layer 120, and then be patterned according to a predetermined pattern to form the gate structure 150. In particular, the ferroelectric stack 130 can be formed by the method as described in FIGS. 8A to 8C, while relevant details will not be repeated for brevity.

Based on the above discussions, it can be seen that the present disclosure offers advantages. It is understood, however, that other embodiments may offer additional advantages, and not all advantages are necessarily disclosed herein, and that no particular advantage is required for all embodiments. When the ferroelectric material is too thick, such as the ferroelectric layer 232 (15 nm), the device performance may be degraded, such as the decreasing memory window as shown in FIG. 2D. This may be due to the ferroelectric layer 232 will gradually degrade its ferroelectricity when the thickness over 15-20 nm. Accordingly, one advantage of the present disclosure is that by inserting a thin dielectric layer between two ferroelectric layers to form a ferroelectric stack, the memory window of the device can be improved without increasing the thickness of each ferroelectric layer. Another advantage is that by forming a ferroelectric stack including a thicker bottom ferroelectric layer and a thinner top ferroelectric layer, the device performance can be further improved.

In some embodiments of the present disclosure, a method includes forming a semiconductor layer over a substrate; depositing a first ferroelectric layer over a channel region of the semiconductor layer; depositing a first dielectric layer over the first ferroelectric layer; depositing a second ferroelectric layer over the first dielectric layer; depositing a gate metal layer over the second ferroelectric layer; patterning the gate metal layer, the second ferroelectric layer, the first dielectric layer, and the first ferroelectric layer to form a gate structure; and forming source/drain regions in the semiconductor layer and on opposite sides of the gate structure. In some embodiments, a thickness of the first dielectric layer is less than a thickness of the first ferroelectric layer and a thickness of the second ferroelectric layer. In some embodiments, depositing the second ferroelectric layer is performed such that the second ferroelectric layer is thinner than the first ferroelectric layer. In some embodiments, the method further includes etching the semiconductor layer to form a semiconductor fin, wherein the first ferroelectric layer wraps around three sides of the semiconductor fin. In some embodiments, the method further includes comprising forming a second dielectric layer over the substrate prior to forming the semiconductor layer; etching the semiconductor layer to form a nanostructure over the second dielectric layer; and etching the second dielectric layer to expose a bottom surface of the nanostructure, wherein after etching the second dielectric layer to expose the bottom surface of the nanostructure, the first ferroelectric layer is deposited to peripherally enclose the nanostructure. In some embodiments, the method further includes forming a third dielectric layer over the semiconductor layer, wherein etching the semiconductor layer to form the nanostructure further comprises etching the third dielectric layer; and removing the third dielectric layer prior to etching the first dielectric layer.

In some embodiments, depositing the first ferroelectric layer is performed such that the first ferroelectric layer is in contact with a top surface of the substrate.

In some embodiments of the present disclosure, a method includes forming a bottom dielectric layer over a substrate and a semiconductor layer over the bottom dielectric layer; etching the semiconductor layer to a nanowire; etching the bottom dielectric layer such that the nanowire is suspended over the substrate; performing a first deposition process to form a first ferroelectric layer wrapping around the nanowire, wherein the first ferroelectric layer has a first thickness; performing a second deposition process to form a first dielectric layer over the first ferroelectric layer and wrapping around the nanowire; performing a third deposition process to form a second ferroelectric layer over the first dielectric layer and wrapping around the nanowire, wherein the second ferroelectric layer has a second thickness less than or equal to the first thickness of the first ferroelectric layer; and forming a gate metal layer over the second ferroelectric layer. In some embodiments, the semiconductor layer is a polysilicon layer. In some embodiments, the first dielectric layer has a third thickness less than the first thickness of the first ferroelectric layer. In some embodiments, the first dielectric layer has a third thickness less than the second thickness of the second ferroelectric layer. In some embodiments, the method further includes patterning the gate metal layer, the second ferroelectric layer, the first dielectric layer, and the first ferroelectric layer to form a gate structure encircling the nanowire. In some embodiments, etching the semiconductor layer also forms a source region and a drain region on opposite ends of the nanowire. In some embodiments, the method further includes performing an ion implantation process on the source region and the drain region, such that the source region and the drain region are of a conductivity type different from a conductivity type of the nanowire.

In some embodiments of the present disclosure, a memory device includes a substrate, a semiconductor layer, a ferroelectric stack, and a gate metal. The semiconductor layer is over the substrate, in which the semiconductor layer includes a channel region and source/drain regions on opposite sides of the channel region. The ferroelectric stack is over the channel region of the semiconductor layer, in which the ferroelectric stack includes a first ferroelectric layer, a dielectric layer over the first ferroelectric layer, and a second ferroelectric layer over the dielectric layer. The gate metal is over the ferroelectric stack. In some embodiments, a thickness of the first ferroelectric layer is equal to or greater than a thickness of the second ferroelectric layer, and a thickness of the dielectric layer is less than the thickness of the first ferroelectric layer and the thickness of the second ferroelectric layer. In some embodiments, a dielectric constant of the dielectric layer is less than a dielectric constant of the first ferroelectric layer and a dielectric constant of the second ferroelectric layer. In some embodiments, the first ferroelectric layer and the second ferroelectric layer are made of a same material. In some embodiments, the memory device further includes an ILD layer over the substrate and in contact with the ferroelectric stack. In some embodiments, the memory device further includes a remaining ferroelectric stack vertically between the gate metal and the substrate, wherein the remaining ferroelectric stack comprises a first layer the same as the first ferroelectric layer, a second layer the same as the dielectric layer, and a third layer the same as the second ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first dielectric layer over a substrate forming a semiconductor layer over the first dielectric layer;

etching the semiconductor layer to form a nanostructure over the first dielectric layer;

etching the first dielectric layer to expose a bottom surface of the nanostructure;

depositing a first ferroelectric layer wrapping around the nanostructure;

depositing a second dielectric layer over the first ferroelectric layer;

depositing a second ferroelectric layer over the second dielectric layer;

depositing a gate metal layer over the second ferroelectric layer;

patterning the gate metal layer, the second ferroelectric layer, the first dielectric layer, and the first ferroelectric layer to form a gate structure; and forming source/drain regions in the semiconductor layer and on opposite sides of the gate structure.

2. The method of claim 1, wherein a thickness of the second dielectric layer is less than a thickness of the first ferroelectric layer and a thickness of the second ferroelectric layer.

3. The method of claim 1, wherein depositing the second ferroelectric layer is performed such that the second ferroelectric layer is thinner than the first ferroelectric layer.

4. The method of claim 1, further comprising forming a third dielectric layer over the semiconductor layer, wherein etching the semiconductor layer to form the nanostructure further comprises etching the third dielectric layer; and removing the third dielectric layer prior to etching the second dielectric layer.

5. The method of claim 1, wherein depositing the first ferroelectric layer is performed such that the first ferroelectric layer is in contact with a top surface of the substrate.

6. A method, comprising:

forming a bottom dielectric layer over a substrate and a semiconductor layer over the bottom dielectric layer, wherein the semiconductor layer is a polysilicon layer;

etching the semiconductor layer to a nanowire;

etching the bottom dielectric layer such that the nanowire is suspended over the substrate;

performing a first deposition process to form a first ferroelectric layer wrapping around the nanowire, wherein the first ferroelectric layer has a first thickness;

performing a second deposition process to form a first dielectric layer over the first ferroelectric layer and wrapping around the nanowire;

performing a third deposition process to form a second ferroelectric layer over the first dielectric layer and wrapping around the nanowire, wherein the second ferroelectric layer has a second thickness less than or equal to the first thickness of the first ferroelectric layer; and forming a gate metal layer over the second ferroelectric layer.

7. The method of claim 6, wherein the first dielectric layer has a third thickness less than the first thickness of the first ferroelectric layer.

8. The method of claim 6, wherein the first dielectric layer has a third thickness less than the second thickness of the second ferroelectric layer.

9. The method of claim 6, further comprising patterning the gate metal layer, the second ferroelectric layer, the first dielectric layer, and the first ferroelectric layer to form a gate structure encircling the nanowire.

10. The method of claim 9, wherein etching the semiconductor layer also forms a source region and a drain region on opposite ends of the nanowire.

11. The method of claim 10, further comprising performing an ion implantation process on the source region and the drain region, such that the source region and the drain region are of a conductivity type different from a conductivity type of the nanowire.

12. A memory device, comprising:

a substrate;

a semiconductor layer over the substrate, wherein the semiconductor layer is a polysilicon layer, and wherein the semiconductor layer comprises a channel region and source/drain regions on opposite sides of the channel region;

a gate structure comprising a ferroelectric stack over the channel region of the semiconductor layer and a gate metal over the ferroelectric stack, wherein the ferroelectric stack comprises:

a first ferroelectric layer;

a dielectric layer over the first ferroelectric layer; and a second ferroelectric layer over the dielectric layer, wherein a thickness of the first ferroelectric layer is greater than a thickness of the second ferroelectric layer; and an interlayer dielectric (ILD) layer surrounding the gate structure, wherein the ILD layer has a portion vertically between a bottom surface of the gate structure and a top surface of the substrate.

13. The memory device of claim 12, wherein a thickness of the dielectric layer is less than the thickness of the first ferroelectric layer and the thickness of the second ferroelectric layer.

14. The memory device of claim 12, wherein a dielectric constant of the dielectric layer is less than a dielectric constant of the first ferroelectric layer and a dielectric constant of the second ferroelectric layer.

15. The memory device of claim 12, wherein the first ferroelectric layer and the second ferroelectric layer are made of a same material.

16. The memory device of claim 12, wherein a sum of a thickness of the first ferroelectric layer and a thickness of the second ferroelectric layer is less than about 30 nm.

17. The memory device of claim 12, wherein the ferroelectric stack wraps around the channel region of the semiconductor layer.

18. The memory device of claim 12, wherein the thickness of the first ferroelectric layer is about 10 nm, and the thickness of the second ferroelectric layer is about 5 nm.

19. The memory device of claim 12, wherein the ILD layer is in contact with the bottom surface of the gate metal of the gate structure.

20. The memory device of claim 12, wherein the first ferroelectric layer and the second ferroelectric layer comprises hafnium zirconium oxide.

* * * * *